(12) United States Patent
Vinciarelli et al.

(10) Patent No.: US 9,269,661 B1
(45) Date of Patent: *Feb. 23, 2016

(54) LOW RESISTANCE POWER SWITCHING DEVICE

(71) Applicant: VLT, INC., Sunnyvale, CA (US)

(72) Inventors: Patrizio Vinciarelli, Boston, MA (US); Sergey Luzanov, Pelham, NH (US)

(73) Assignee: VLT, INC., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/597,086

(22) Filed: Jan. 14, 2015

Related U.S. Application Data

(63) Continuation of application No. 13/789,065, filed on Mar. 7, 2013, now Pat. No. 8,975,694.

(51) Int. Cl.
| | | |
|---|---|---|
| *H01L 23/48* | (2006.01) | |
| *H01L 23/50* | (2006.01) | |
| *H01L 27/088* | (2006.01) | |
| *H01L 21/768* | (2006.01) | |

(52) U.S. Cl.
CPC .......... *H01L 23/50* (2013.01); *H01L 21/76895* (2013.01); *H01L 27/088* (2013.01); *H01L 2224/131* (2013.01); *H01L 2224/291* (2013.01); *H01L 2924/14* (2013.01)

(58) Field of Classification Search
CPC ............. H01L 2924/014; H01L 2224/131; H01L 2224/291; H01L 2924/1305; H01L 2924/00; H01L 2224/0401; H01L 2224/04026; H01L 2224/05551; H01L 2224/05552; H01L 2224/05555; H01L 2224/05624; H01L 2224/05644; H01L 2224/05647; H01L 2224/05655; H01L 2224/05666; H01L 2224/05669; H01L 2224/06051; H01L 2224/16225; H01L 2224/32225; H01L 2224/73203; H01L 23/4824; H01L 23/49844; H01L 24/05; H01L 24/06; H01L 24/13; H01L 24/16; H01L 24/29; H01L 24/32; H01L 24/73; H01L 2924/13091
USPC .......................... 257/341, 668, 678, 690, 773; 438/64–66
See application file for complete search history.

(56) References Cited

U.S. PATENT DOCUMENTS

| | | | | |
|---|---|---|---|---|
| 4,152,714 | A | * 5/1979 | Hendrickson | .......... H01L 29/04 257/341 |
| 4,891,686 | A | * 1/1990 | Krausse, III | ........ H01L 23/4006 174/252 |
| D328,599 | S | 8/1992 | Gloton | |

(Continued)

OTHER PUBLICATIONS

Efficient Power Conversion Corporation, "EPC1012—Enhancement Mode Power Transistor Datasheet". 2011, www.epc-co.com.

(Continued)

*Primary Examiner* — Mohammed Shamsuzzaman
(74) *Attorney, Agent, or Firm* — Foley & Lardner LLP

(57) ABSTRACT

A semiconductor device includes a semiconductor substrate with doped regions of a first type and doped regions of a second type. A first metallization layer connects to the doped regions of the first type through conductive paths, such that current is able to flow within the metallization layer along a plurality of linear axes. A second metallization layer connects to the doped regions of the second type through conductive paths, such that that current is able to flow within the metallization layer along a plurality of linear axes. Contacts on an exterior surface of the semiconductor device can be arranged concentrically.

18 Claims, 19 Drawing Sheets

(56) References Cited

U.S. PATENT DOCUMENTS

| | | | |
|---|---|---|---|
| 5,187,552 A * | 2/1993 | Hendrickson | H01L 21/765 257/365 |
| 5,401,910 A | 3/1995 | Mandai et al. | |
| 5,585,670 A | 12/1996 | Isshiki et al. | |
| D396,846 S | 8/1998 | Nakayama et al. | |
| D396,847 S | 8/1998 | Nakayama et al. | |
| 5,844,307 A | 12/1998 | Suzuki et al. | |
| 6,238,953 B1 | 5/2001 | Tanaka et al. | |
| D444,132 S | 6/2001 | Iwanishi et al. | |
| 6,353,258 B1 * | 3/2002 | Inoue | H01L 23/5386 257/690 |
| D456,367 S | 4/2002 | Matteson | |
| D466,093 S | 11/2002 | Ebihara et al. | |
| D473,199 S | 4/2003 | Sako et al. | |
| D476,959 S | 7/2003 | Yamada et al. | |
| D476,962 S | 7/2003 | Yoshihira et al. | |
| D480,371 S | 10/2003 | Sako et al. | |
| 6,710,441 B2 * | 3/2004 | Eden | H01L 23/4824 257/341 |
| D489,338 S | 5/2004 | Seddon et al. | |
| D504,874 S | 5/2005 | Celaya et al. | |
| 6,891,223 B2 * | 5/2005 | Krumrey | H01L 29/7813 257/330 |
| D510,778 S | 10/2005 | Angeletta | |
| 6,969,909 B2 | 11/2005 | Briere | |
| 7,038,917 B2 * | 5/2006 | Vinciarelli | H01L 23/49833 174/255 |
| 7,166,898 B2 | 1/2007 | Briere | |
| 8,021,918 B2 * | 9/2011 | Lin | H01L 21/76816 257/678 |
| RE44,372 E * | 7/2013 | Vinciarelli | H05K 7/209 165/185 |
| D699,201 S | 2/2014 | Petsch | |
| D701,843 S | 4/2014 | Masuda | |
| 2004/0004272 A1 * | 1/2004 | Luo | H01L 23/49575 257/666 |
| 2005/0269647 A1 * | 12/2005 | Briere | H01L 23/4824 257/401 |
| 2008/0122014 A1 * | 5/2008 | Shimomura | H01L 29/78 257/401 |
| 2010/0096756 A1 * | 4/2010 | Tagami | H01L 21/76843 257/762 |
| 2012/0299069 A1 * | 11/2012 | Kuhn | H01L 21/76843 257/288 |

OTHER PUBLICATIONS

Notice of Allowance mailed Aug. 28, 2014 in U.S. Appl. No. 29/448,057 (13 pgs.).

Notice of Allowance mailed Oct. 31, 2014 in U.S. Appl. No. 13/789,065, 18 pages.

Product Information, ST Dual N-Channel 30 V, Ω typ., 11 A STripFET® V Power MOSFET in a PowerFLAT® 5×6 double island, Doc ID 18416 Rev 3, Dec. 2012, www.st.com (14 pages).

* cited by examiner

LOW RESISTANCE POWER SWITCHING DEVICE

CROSS REFERENCE TO RELATED APPLICATIONS

The present application is a continuation of U.S. application Ser. No. 13/789,065, filed Mar. 7, 2013, which is incorporated herein by reference in its entirety.

SUMMARY

Integrated transistors can be used in power switching applications. Multiple individual integrated transistors are wired using multiple metallization layers to form a power switching device. The device presents the multiple integrated transistors as a single low-resistance switch. The power switching device of the present disclosure may preferably be formed of metal oxide semiconductor field effect transistors (MOSFET), III-V semiconductor transistors and/or bipolar transistors and further may be a power MOSFET. Particularly low resistance is achieved by techniques used to form conductive pathways to wire transistor elements in parallel. Such devices are useful in a variety of applications, especially including power switching, power conversion, and power regulation systems where efficiency of the power conversion is important.

DETAILED DESCRIPTION

Figure 1:
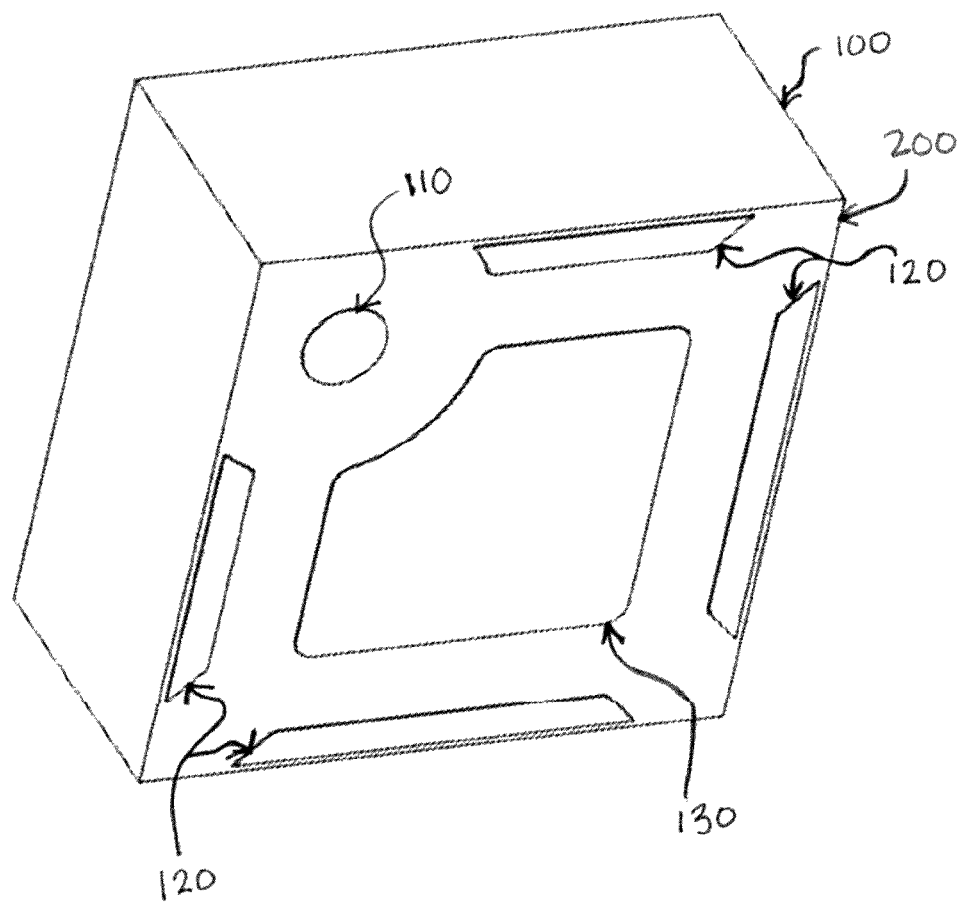
FIG. 1 is a perspective view of an example of the bottom of a semiconductor die for a power switching device.

The inventors have perceived the aspects described in the present disclosure. In this disclosure, the terms "up" and "down", "above" and "below", "top" and "bottom", etc. relate to opposite directions, and do not specify a particular gravitational frame of reference.

A power switching device can have the functionality of a transistor, such that a certain voltage level applied to one terminal (for example, a "gate") will dramatically reduce the resistance across two other terminals (for example, a "source" terminal and a "drain" terminal). This has the effect of switching the source-drain connection on and off by applying a voltage level to a gate.

Many high-power applications require low on-state resistance and high current carrying capacity, e.g. between the source and drain terminals of a power MOSFET. Such low resistance and high current requirements are typically beyond the capabilities of individual transistor elements but are instead met by a plurality, e.g. thousands or more, individual transistor elements formed in a common semiconductor substrate or die, such as silicon, using integrated circuit fabrication techniques. The individual transistor elements on a semiconductor die may be connected together in parallel using conductive layers formed over the die and connected to common terminals, e.g. gate, drain, and source terminals for a MOSFET, to function together as a single power device. Thus, it is advantageous to connect numerous such transistor elements in parallel to reduce the aggregate on-resistance and increase the current carrying capacity of the power device, such that each transistor carries only a small fraction of the available current. In this manner, a switching device made from integrated transistors can offer much lower on-resistance and carry much higher currents than individual transistor elements.

In a power conversion or power regulation application, the efficiency of a power switching device can be very important. The on-state efficiency of a switch is linearly related to the total electrical resistance of the power switching device from terminal to terminal, e.g. between the source and drain terminals of a MOSFET. The total resistance of the power switching device can be conceptually divided into two parts: resistance attributable to the device as formed in the semiconductor substrate, e.g. the source-drain channel resistance when the device is fully on and allowing current flow (the "semiconductor resistance"), and resistance attributable to the wiring required to connect such transistors to the device terminals (the "interconnection resistance").

The wiring required to connect such transistors to the device terminals can be created using integrated circuit fabrication techniques. Because the semiconductor substrate may contain many small transistors distributed over the active area of the die, and because these transistors each need to be connected (in parallel) to the device terminals, the conductive paths required for such wiring can become quite complex. It is therefore advantageous to use various "metallization" layers that are separated from one another by insulating material. Such metallization layers provide a plane in which conductive metal pathways are formed. The use of metallization layers allows various metal connections to cross over or under other metal connections without causing a short circuit. The arrangement of these metallization layers can significantly affect the overall on-resistance of the device. Ultimately, it is advantageous to have the parallel connections be exposed on the exterior of the semiconductor die in a simple pattern, such that the thousands of individual integrated transistor connections are gathered in parallel and presented as only a few contacts, which can be easily attached to a circuit board. Methods of attachment may include surface mount methods, such as a chip-scale Land Grid Array ("LGA") method, but can in principle be any form of connection technique available for connecting a semiconductor device to a circuit board.

In one particular aspect of the power switching device, a large number of lateral MOSFETs cells or elements may be formed in a semiconductor substrate, such as silicon, and connected in parallel. The MOSFET cells may be formed by doping the semiconductor material with different elements or compounds as known in the semiconductor art. Gate, source, and drain areas of the multiple MOSFETs are available at the surface of the semiconductor substrate. Conductive pathways are formed in successive "metallization," "metal" or "wiring" layers over the surface of the semiconductor substrate, and portions of the conductive areas in successive layers are electrically connected to each other through vertically extending "vias." A via may be any size or shape of conductive material extending through a non-conductive material. The conductive areas on each layer, and the vias between layers, are used to connect together various ones of the gates, sources, and drains of the multiple MOSFETs together in such a fashion that a substantial number of the multiple MOSFETs are effectively wired in parallel within the power switching device die. Further, the conductive pathways and vias provide conductive paths between the gate, source and drain connections of the parallel-wired MOSFETs and respective gate, source, and drain connection areas ("contacts" or "lands") at the exterior of the power switching device die.

The total of the source-related conductive paths in the layers between the semiconductor substrate and the MOSFET die external source connection areas is referred to herein as the "source terminal". The total of the drain-related conductive paths in the layers between the semiconductor substrate and the MOSFET die external drain connection areas is referred to herein as the "drain terminal". The total of the gate-related conductive paths in the layers between the semiconductor substrate and the MOSFET die external gate connection areas is referred to herein as the "gate terminal". It is desirable to minimize the resistance of the source, drain and gate terminals.

Resistance of a volume of material can be considered as follows. For an elongated material with a constant cross sectional area (such as a wire), resistance is related to the ratio of the length to the cross-sectional area of the material. To lower resistance, length may be reduced or cross-sectional area may be increased, for example. Thus, for two identical volumes of conductive material, the wider, shorter one will have lower resistance than the narrower, longer one. As described in the figures and text relating to a preferred embodiment, resistance in the present design is lowered by (conceptually) both reducing the length of conductive pathways and by effectively increasing the cross-sectional area of the conductive paths. In particular, the source contacts of multiple MOSFETs are electrically connected in parallel through a nearby shared large area of conductive material in order to reduce the source terminal resistance. Without being bound to a particular theory of operation, it is believed that the large area of conductive material allows source current to propagate in a large number of different directions to reach its destination, rather than along a linear conductive interconnect. This can be conceptualized as both an increase in the cross-sectional area of the conductor seen by the source current, and a shortening of the source current conductor pathway. In like manner, the drain contacts of multiple MOSFETs are electrically connected in parallel to a nearby shared large area of conductive material, in order to reduce drain terminal resistance. The external contacts can be advantageously presented with a central drain contact and source contacts substantially surrounding the drain contact, or less preferably vice versa.

The total resistance of the device (i.e. the resistance experienced by a current passing from the external drain to the external source terminals, or vice versa) when fully on may be reduced according to the present disclosure. One aspect of such reduction relates to the following principles. As the semiconductor die increases in area, and the number of MOSFET elements connected in parallel increases accordingly, and the semiconductor resistance will decrease as a result of the increased paralleling of the MOSFET elements. However, the interconnection resistance will increase with increasing die area, because the average connection distance between the MOSFET elements and the external terminals increases, and these connections are made from conductors that have some resistance. This resistance (the "interconnection resistance") can be added to the semiconductor resistance. The total resistance of the device when fully on is a function of this sum. Because the semiconductor and interconnection components of total device resistance scale differently with increasing die size, it is possible to find an ideal device size from the perspective of total switching resistance. Also, by using multiple devices having smaller die dimensions in parallel, the resistance of the group of device (e.g., when operating as a switch in a power conversion application) can be improved as compared to the use of fewer, larger devices. This is because multiple devices will add to the parallelism of the individual MOSFET switching elements, while not increasing the interconnection resistance of any single device.

Preferably, the interconnection resistance of an individual device when fully on is less than or equal to half of the semiconductor resistance of the power switching device. Even more preferably, the interconnection resistance when fully on is less than or equal to 40% of the semiconductor resistance. Even more preferably, the interconnection resistance when fully on is less than or equal to 30% of the semiconductor resistance. Additionally, the gates of multiple MOSFETs are electrically connected such that all interconnected gates are energized approximately concurrently.

In the following paragraphs, an example of a power switching device will be explained in reference to the figures. The example device is embodied in a semiconductor die that can be, for example, LGA mounted to a circuit board. In the following description, the vertical frame of reference has the semiconductor substrate at the bottom, and the external terminals at the top.

FIG. 1 illustrates an example of a die 100 for a power switching device as described in the present disclosure. Die 100 is shown from the top 200, highlighting some of the characteristics of die 100 that are of relevance in understanding the concepts presented herein.

The top surface 200 of die 100 includes areas 110, 120, and 130 for connection to a printed circuit board (PCB) or other receiving structure. Connection areas 110, 120, and 130 are areas of conductive material, such as metal, such as Gold, Copper, Aluminum, Titanium, Platinum, Nickel, etc. and alloys or layered structures thereof. For the power switching device included in die 100, area 110 is a gate connection, areas 120 are source connections, and area 130 is a drain connection. Source connection areas 120 are arranged concentrically along the edge of die 100, which means that they approximately surround the center connection 130, although there might not be complete enclosure, and the inner and outer arrangements might not be circular.

In the example of FIG. 1, connection areas 120 are source connections and connection area 130 is a drain connection. In alternative embodiments, connection areas 120 may be drain connections and connection area 130 a source connection. Selection of one arrangement or the other may be based on whether the semiconductor substrate is at the same electrical potential as the source or drain of individual transistors. This is because, when soldering die 100, some solder may extend beyond the designated pad areas of a printed circuit board (PCB) and make electrical connections that were not part of the design (i.e., unwanted shorts). Therefore, the choice as to where to place source and drain terminals may be based on an analysis of how a circuit would behave if the source or drain were shorted to a substrate potential. The arrangement of conductive areas 110, 120 and 130 on the top 200 of semiconductor die 100 allows for decreased resistance by cooperating with structures on the interior of die 100 (described below) and easier mounting of the semiconductor die to a circuit board.

The structure of the interconnecting layers between the connection areas 120 and 130 and the semiconductor substrate provide for the effective resistance of the terminals of the power switching device to be lower than the terminal resistance of other power switching device structures.

The following description of a preferred embodiment of a power switching device illustrates concepts that allow for reduced terminal resistance and increased current capability in the power switching device. Cross-sectional views of die 100 are presented, wherein the plane of the cross-sections is parallel to the top surface 200 of die 100. Cross-sections may be, but are not necessarily, representative of process masks. No thickness of any conductive or non-conductive material is intended to be illustrated by the figures. Cross-sections may represent infinitesimally thin slices of the power switching device.

For a better understanding of the concepts presented herein, cross-sections are described in an order starting from the top 200 of die 100 and moving down to the semiconductor substrate within die 100. The terms "below" and "above" are thus with respect to bottom of die 100 such that below is further toward the semiconductor substrate and above is toward top 200. Fabrication of die 100 would generally be performed with the same frame of reference, starting at the semiconductor substrate and adding sequential layers to the semiconductor substrate, the layering ending, for example, at the exterior surface of die 100.

Figure 2:
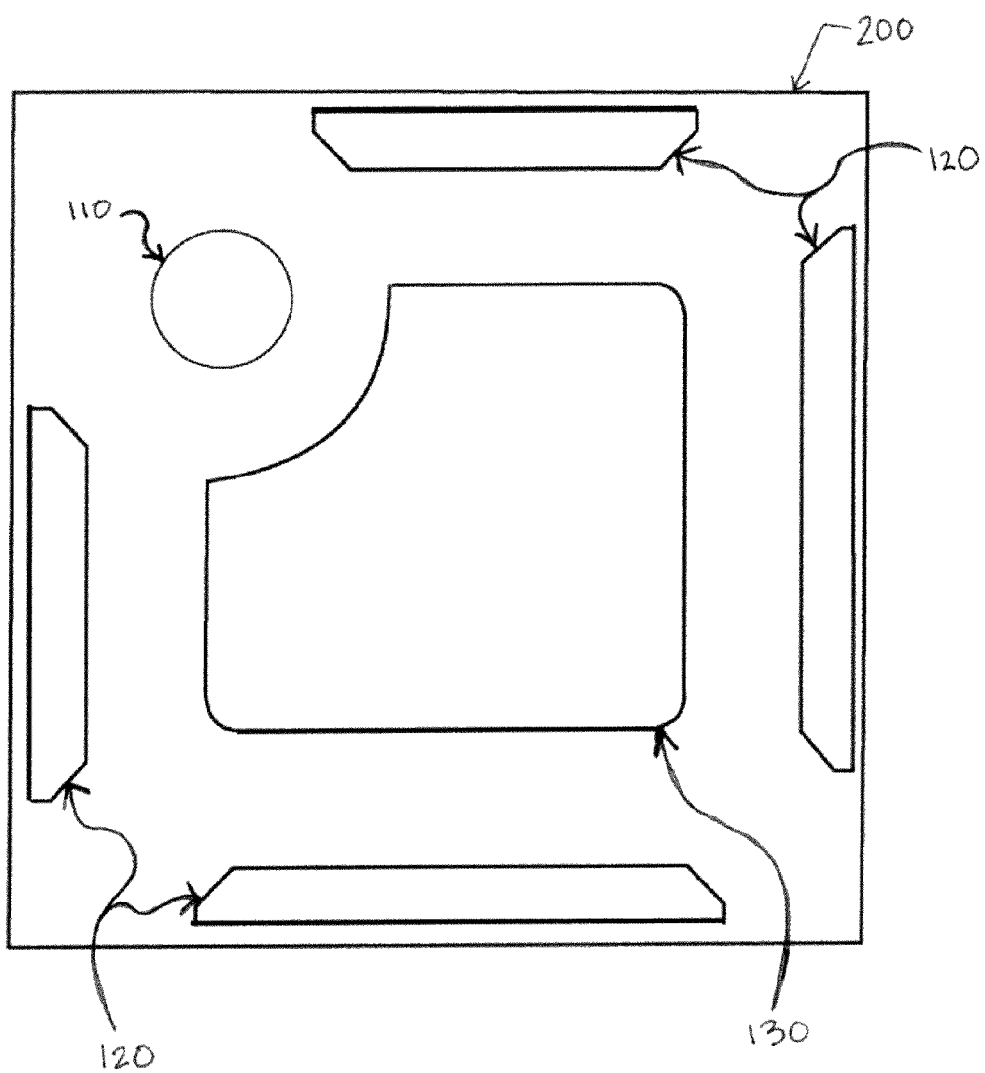
FIG. 2 is a plan view of the die of FIG. 1.

FIG. 2 illustrates the die top 200 of die 100 of FIG. 1 in two-dimensional form. Connection areas 110, 120, and 130 are conductive material, and the remainder of die top 200 is formed of non-conductive material. The non-conductive material of die top 200 may be a packaging material, an encapsulating material, insulating material, or etch resist material, for example. As described with respect to FIG. 1, areas 110, 120, and 130 provide contact to the power switching device gate, source, and drain, respectively.

In some implementations, areas 110, 120, and 130 are portions of an interior conductive layer that are exposed at the die top 200. In some implementations, one or more of areas 110, 120, and 130 are material built up on an exposed interior conductive layer. For example, one or more of areas 110, 120, and 130 can represent a gold layer or a solder paste layer.

One or more of areas 110, 120, and 130 may be constructed in layers, where the layers may be of the same, similar, or different conductive materials. The conductive materials used in areas 110, 120, and 130 may be the same for each area, but also may be different between areas.

Figure 3:
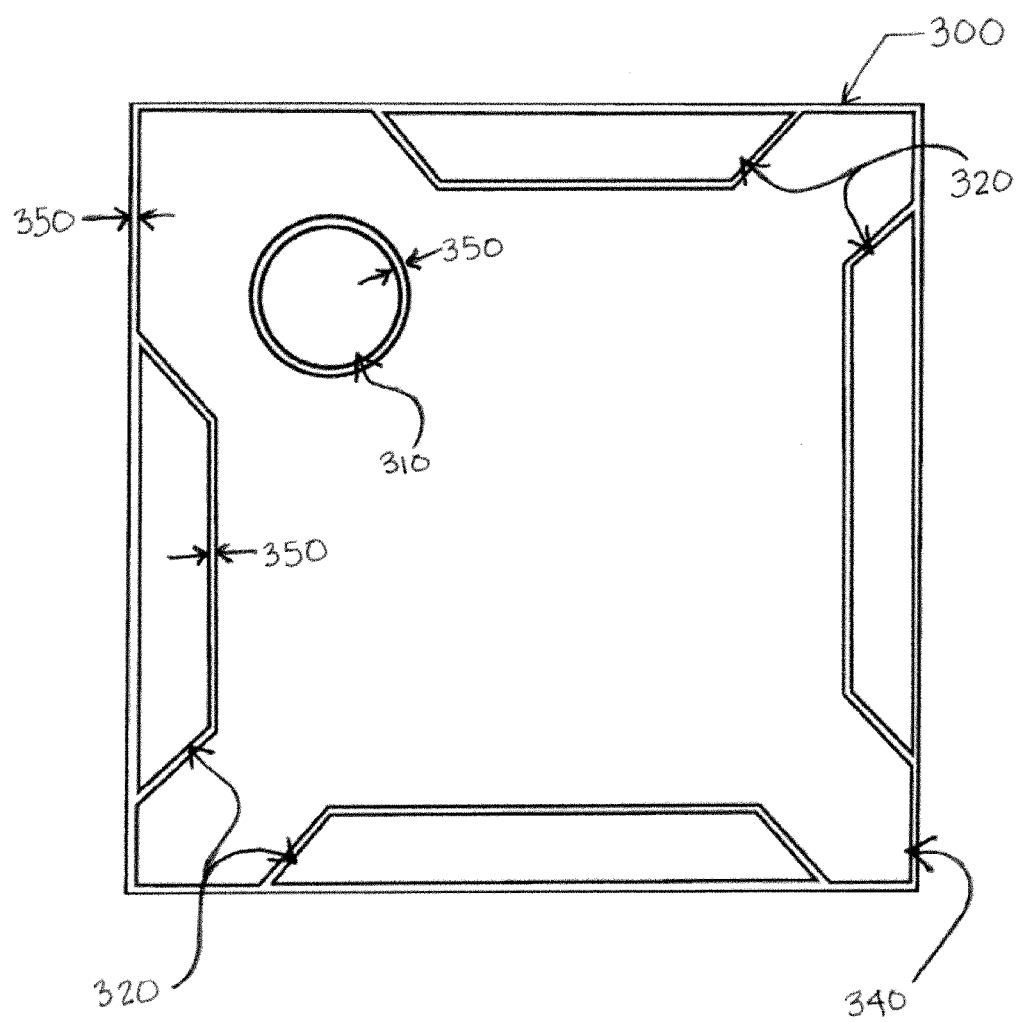
FIG. 3 conceptually illustrates a cross-section of an example power switching device.

FIG. 3 illustrates a cross-section 300 within die 100 below top 200 of die 100. FIG. 3, like the figures that follow it, is conceptual, and not intended to be used for measurements of scale or for counting the precise numbers of various features.

Cross-section 300 includes distinct conductive areas 310, 320, and 340. Between each of the conductive areas 310, 320, and 340 of cross-section 300 is a non-conductive material 350. Conductive areas 310, 320, and 340 may be directly and partially or wholly exposed at die top 200 or may be in direct contact with the conductive material of die top 200. Cross-section 300 may represent a cross-section through a patterned metal or "metallization" layer.

Conductive area 340 serves as a collection layer for connection area 130 of FIGS. 1 and 2. That is, the conductive area 340 in this embodiment conducts drain current (although source current would also be possible). The drain current arises from connections with numerous semiconductor transistors fabricated in the semiconductor substrate (in a lower cross-section). These transistors preferably occupy a large portion of the area of the substrate, in order to increase the number of devices that can be wired in parallel. In other words, if one were to look through FIG. 3 at the transistor pattern below, one would see transistors covering most of the square outline of the die in FIG. 3. As shall be seen in the following disclosure, this creates the need for small drain connections more or less evenly distributed across the entirety of the horizontal area of the semiconductor die. These drain connections ultimately lead to a connection area 130 in the center of the top of the die. This requires vertical wiring from the semiconductor substrate through intervening layers to the top surface of the die. This vertical wiring can be in the form of a potentially large number of vias. As will be seen in the following disclosure, a large number of vias are electrically connected to the conductive area 340 at places distributed across the horizontal extent of conductive area 340. Current emerging from these vias (noting that current flow can be viewed from the perspective of either positive or negative charge carriers) enters the conductive area 340 and effectively experiences a potential conductive pathway in all or most horizontal directions, and certainly in more directions than would be available if the wiring in this layer were completed using linear interconnects.

Figure 3B:
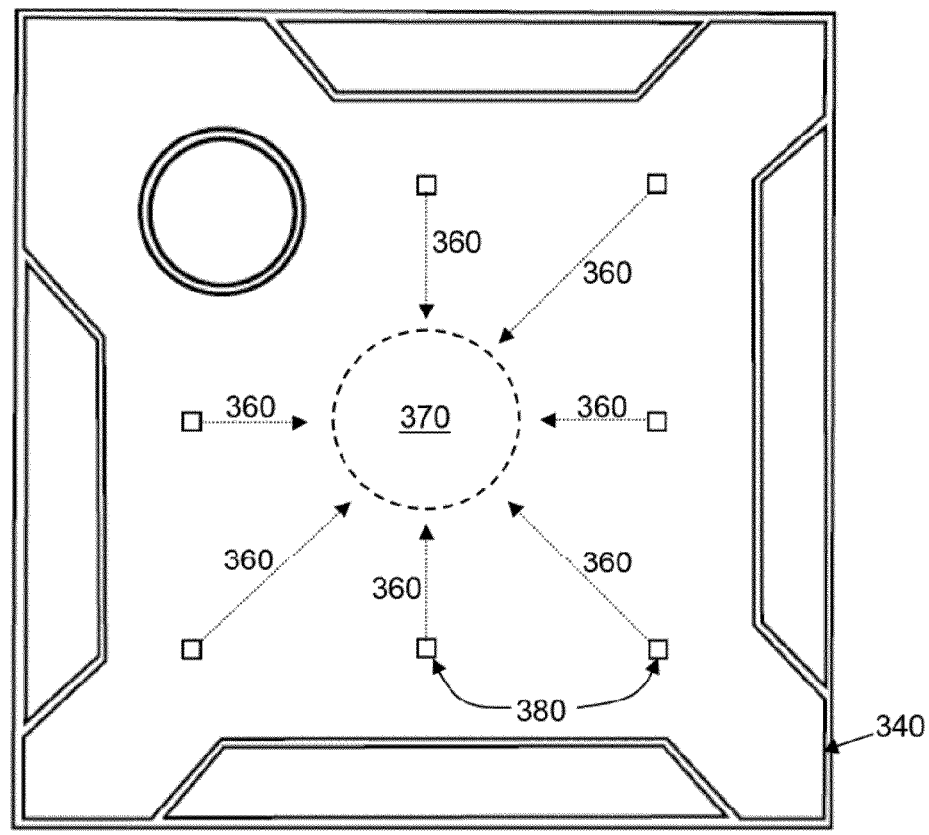
FIG. 3B conceptually illustrates current flow in an example cross-section of FIG. 3.

This is shown in FIG. 3B, in which a representative area 370 representing connection area 130 is shown (dashed lines). Although area 370 is shown as a circle in FIG. 3B for clarity, the actual area may essentially be the same shape and size as connection area 130. In FIG. 3B, there are shown dotted arrows 360 representing principal axes of current flow through area 340, from intersection points with several representative vias 380 toward the central contact area 370 (or vice versa). In particular, current exiting a via 380 will spread out forming a distribution of current paths between the via and the contact area, however the respective average directions of flow from each connection point 380 will be along principal axes 360. Because of the arrangement of connection points (e.g. vias 380) with area 340, current will flow toward the area 370 along a plurality of non-parallel principal axes. Each axis in the plurality of non-parallel principal axes has an angle relative to an arbitrarily chosen axis in the same plane. In this way, the plurality of non-parallel principal axes forms a series of axes having a continuum of such angles relative to an arbitrarily chosen axis. Preferably, such a plurality having a continuum of angles comprises at least three such non-parallel principal axes. Even more preferably, however, 4, 5, 6, 7, 8 or more principal axes will be involved. Conceptually speaking, this technique effectively reduces the length and increases the cross-sectional area of conductors that lead current from drain contacts to the exterior contact 130 compared to prior art techniques that use cross grids of alternating parallel conductor strips on multiple layers, thereby lowering resistance of the overall drain terminal.

Figure 3C:
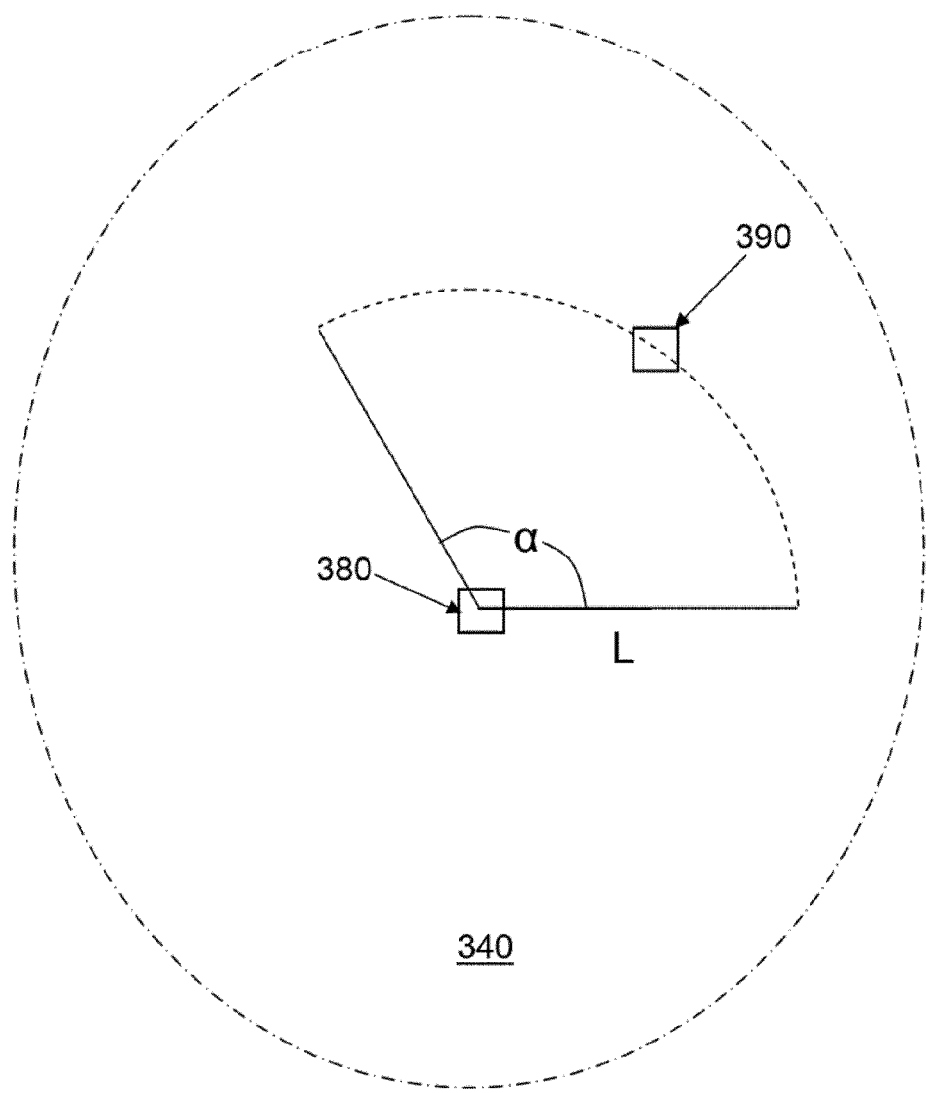
FIG. 3C conceptually illustrates an enlarged portion of the cross-section of FIG. 3.

Area 340 forms a surface of relatively consistent thickness that extends horizontally in more than one direction for at least a certain length. FIG. 3C shows close-up view of conductive area 340 and intersection points 380 and 390 with two vias connecting with area 340 within an oval-shaped cutout of area 340. Current emerging from a via 380 into conductive area 340 experiences conductive material in substantially all directions, and in particular within an arc spanning an angle α for at least a length L, where the arc is filled with conductive material. The angle of the arc is preferably at least 30 degrees measured at the intersection point with a via, more preferably at least 60 degrees, more preferably at least 90 degrees, more preferably at least 120, 150, 180, 210, 240, 270, 300, 330 and 360 degrees. The length L of such horizontal extension is preferably at least the shortest distance between intersection points with vias within area 340, for example, the distance L between via intersection points 380 and 390. Still more preferably, the surface extends horizontally from each of the intersection points with at least two vias in at least the preferred arcs. Preferably, at least two via intersection points will be surrounded by conductive material in at least the preferred arcs. Still more preferably, all or substantially all (at least two-thirds) of the intersection points will be surrounded by conductive material in at least the preferred arcs.

As can be seen from a comparison of FIGS. 2 and 3, conductive area 310 generally aligns with conductive area 110. Conductive area 110 may be an exposed portion of conductive area 310, or alternatively conductive material in electrical contact with conductive area 310. Conductive areas 320 generally align with corresponding conductive areas 120. Conductive areas 120 may be exposed portions of conductive areas 320, or alternatively conductive material in electrical contact with conductive areas 320.

As can be seen from a comparison of FIGS. 2 and 3, conductive area 130 falls within the outline of larger conductive area 340. Conductive area 130 may be an exposed portion of conductive area 340, or alternatively conductive material in electrical contact with conductive area 340.

Figure 4:
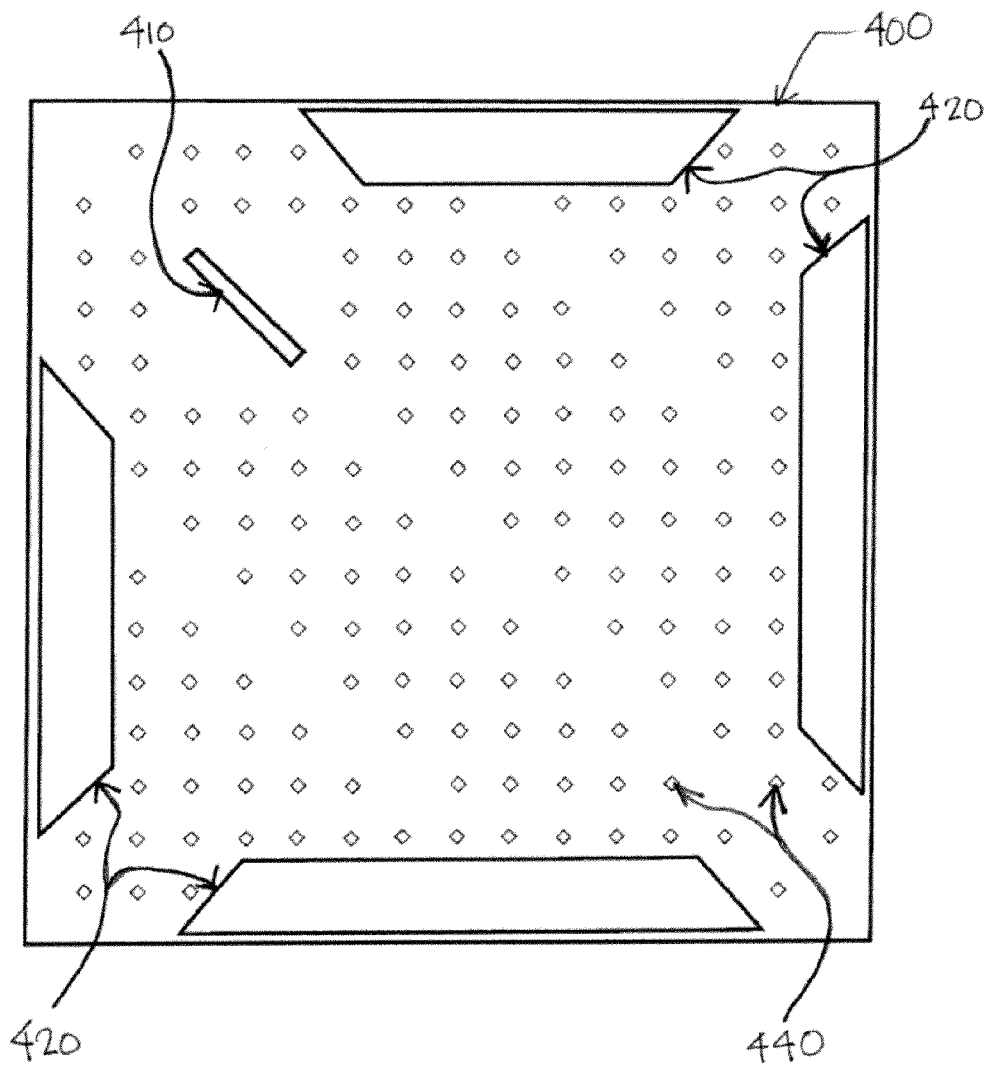
FIG. 4 conceptually illustrates another cross-section of an example power switching device.

FIG. 4 illustrates a next cross-section 400 below cross-section 300 of FIG. 3. In cross-section 400, areas denoted 410, 420, and 440 are conductive areas in an otherwise non-conductive material. For example, areas 410, 420, and 440 may be metal via structures in a dielectric material.

As can be seen from a comparison of FIGS. 3 and 4, conductive area 410 aligns with conductive area 310 and conductive areas 420 align with conductive areas 320. A comparison of FIGS. 3 and 4 further shows that conductive areas 440 fall within the outline of conductive area 340. Electrical connections between area 310 and area 410, areas 320 and areas 420, and area 340 and areas 440 allow for electrical connection from cross-section 300 through cross-section 400 to lower sections.

Figure 5:
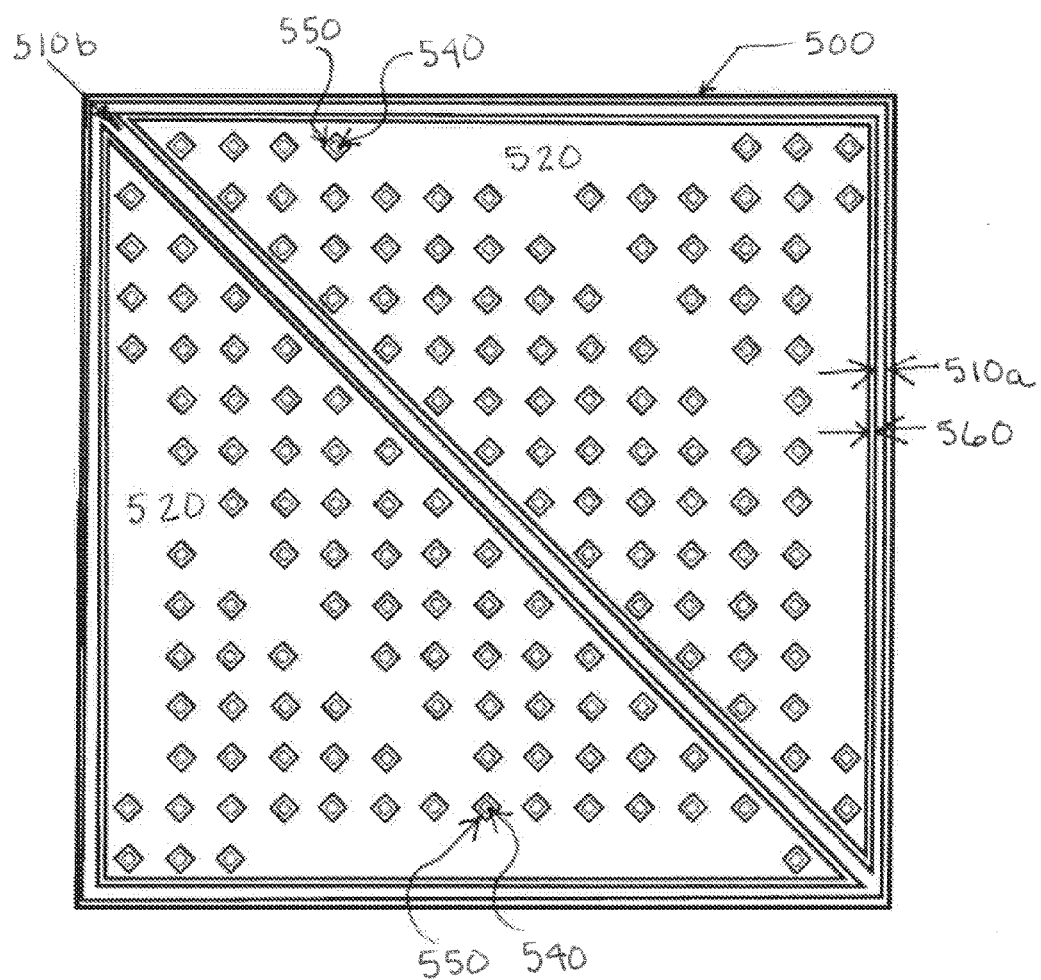
FIG. 5 conceptually illustrates another cross-section of an example power switching device.

FIG. 5 illustrates a cross-section 500 below and in electrical contact with cross-section 400 of FIG. 4. Cross-section 500 includes conductive areas 510a and 510b, 520, and 540 and insulating areas 550 and 560, which are composed of a dielectric oxide or the like. Cross-section 500 may represent a cross-section through a patterned metal layer.

Conductive area 510a is disposed along the periphery of cross-section 500, optionally separated from the edge of cross-section 500 by insulating area 570 as shown, and a strip 510b through a diagonal of cross-section 500 such that strip 510b contacts and electrically connects with area 510a on both ends of strip 510b. As can be seen from a comparison of FIGS. 4 and 5, diagonal strip 510b overlays conductive area 410 of cross-section 400. Conductive areas 510a and 510b are both in electrical connection with conductive area 410. Conductive areas 510a and 510b can be positioned over inactive areas of the semiconductor substrate.

Conductive areas 520 are shown as triangularly-shaped, separated from conductive areas 510a and 510b by spaces 560 and perforated by insulating areas 550 and vias 540. As can be seen from a comparison of FIGS. 4 and 5, conductive areas 520 are solid where they are disposed below conductive areas 420 of cross-section 400. Conductive areas 520 are electrically connected to conductive areas 420. Conductive areas (vias) 540 are formed within spaces 550 such that conducive areas 540 are physically and electrically separated from conductive areas 520.

Conductive areas 520 serve as a collection layer for connection areas 120 of FIGS. 1 and 2. That is, the triangular conductive areas 520 in this embodiment conduct source current (although drain current would also be possible). The source current arises from connections with the numerous semiconductor transistors in the semiconductor substrate. As noted above, these transistors preferably occupy a large portion of the area of the substrate, in order to increase the number of devices that can be wired in parallel. In other words, if one were to look through FIG. 5 at the transistor pattern below, one would see transistors covering most of the square outline of the die in FIG. 5, except perhaps beneath the gate contacts 510a and 510b. As shall be seen in the following disclosure, this creates the need for small source connections more or less evenly distributed across the entirety of the horizontal area of the semiconductor die. These source connections ultimately lead to connection areas 120 disposed concentrically around the center and along the perimeter of the top 200 of the die. This requires vertical wiring from the semiconductor substrate through intervening layers to the top surface of the die. This vertical wiring can be in the form of a potentially large number of vias. As will be seen in the following disclosure, a large number of vias are electrically connected to the conductive areas 520 at places distributed across the horizontal extent of conductive areas 520. Current emerging from these vias (noting that current flow can be viewed from the perspective of either positive or negative charge carriers) enters the conductive areas 520 and flows outward toward the perimeter effectively a potential conductive pathway in all or most horizontal outward directions, and certainly in more outward directions than would be available if the wiring in this layer were completed using linear interconnects. This arrangement effectively reduces the length and increases the cross-sectional area of path through the conductors that lead current from source contacts to the exterior contact areas 120 in a manner similar to that explained with reference to FIG. 3B, above, lowering resistance of the overall source terminal.

Figure 5B:
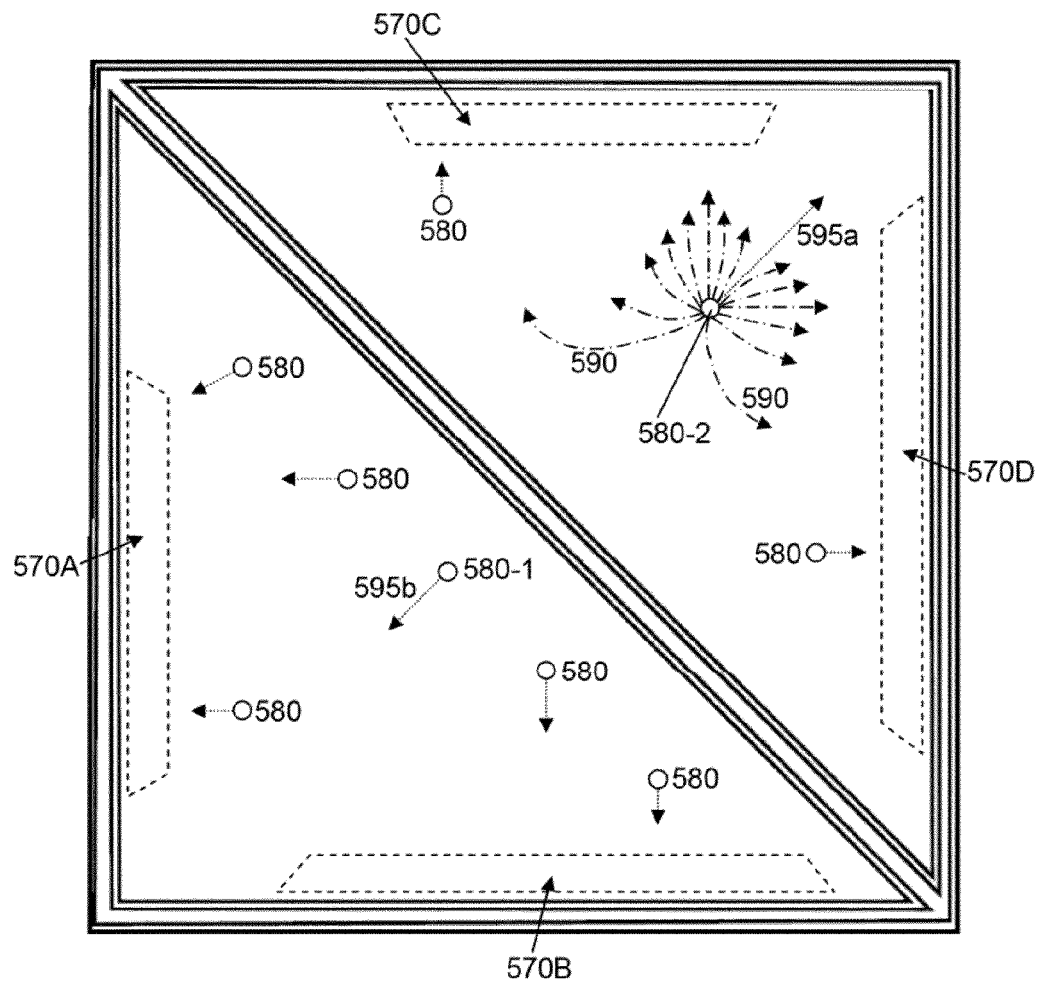
FIG. 5B conceptually illustrates an enlarged portion of the cross-section of FIG. 5.

The outward current flow is conceptually shown in FIG. 5B, in which a representative areas 570A, 570B, 570C, 570B representing connections to connection areas 120 are shown (dashed lines) on FIG. 3. In FIG. 5B, there are shown dotted arrows 595 representing principal axes of current flow entering areas 520 from connection points with a selected number of representative vias 580 toward the areas 570A, 570B, 570C, 570B (or vice versa). Although dotted arrows 595 show the principal axis of current flow, it will be understood that current exiting each via 580 will spread out forming a distribution whose average may be aligned primarily with axis 595. For example, the connection point with via 580-2 in the upper right-hand portion of FIG. 5B would show a distribution of flow paths, conceptually represented by dot-dash arrows 590. In that case, the principal axis of flow, representing the average direction of flow, is shown by dotted arrow 595*a*. Similarly, for intersection point with via 580-1, the principal axis of current flow 595*b* is diagonally down and to the left, representing the average direction of the distribution of flow paths generally toward areas 570*a* and 570*b*.

Figure 5C:
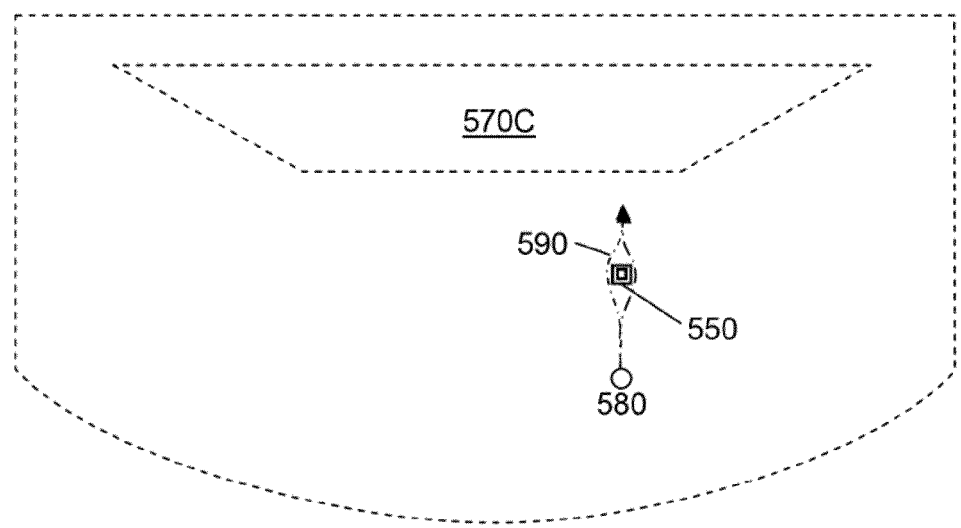
FIG. 5C shows a magnified portion of FIG. 5B, including connection area 570C.

Current flow paths are further explained with reference to FIG. 5C, which shows a magnified portion of FIG. 5B, including connection area 570C. An intersection point with a via 580 is shown. Current exits the intersection point with via 580 and initially flows toward area 570C along flow lines 590, shown by dot-dash arrows. When the flow encounters the insulating area 550 surrounding a non-intersecting via (see FIG. 5), the flow lines diverge and re-converge, such that a principal axis is maintained.

Returning to FIGS. 5 and 5B, because of the arrangement of connection points (e.g. vias 580) with area 520, current will flow outward toward the sides of triangular area 520, i.e. outward toward the perimeter of the die toward the connections with connection areas 120, along a plurality of non-parallel principal axes. Each axis in the plurality of non-parallel principal axes has an angle relative to an arbitrarily chosen axis in the same plane. In this way, the plurality of non-parallel principal axes forms a series of axes having a continuum of such angles relative to an arbitrarily chosen axis. Preferably, such a plurality having a continuum of angles comprises at least three such non-parallel principal axes. Even more preferably, however, 4, 5, 6, 7, 8 or more principal axes will be involved. Conceptually speaking, this technique effectively reduces the length and increases the cross-sectional area of conductors that lead current from drain contacts to the exterior contacts 120 compared to prior art techniques that use cross grids of alternating parallel conductor strips on multiple layers, thereby lowering resistance of the overall source terminal.

In a manner analogous to that explained with reference to FIG. 3C, above, the amount of conductive material around an intersection point with a via within conductive areas 520 is preferably such that current emerging at such an intersection point experiences a wide conductor.

Revisiting FIGS. 2-5, it can be seen that the gate connection area 110 of FIG. 2 is electrically connected to the conductive area 510 of FIG. 5 through conductive area 310 of FIG. 3 and conductive area 410 of FIG. 4. It can also be seen that source connection areas 120 of FIG. 2 are electrically connected to conductive areas 520 of FIG. 5 through conductive areas 320 of FIG. 3 and conductive areas 420 of FIG. 4. It can further be seen that drain connection area 130 of FIG. 2 is electrically connected to the multiple conductive areas 540 of FIG. 5 through the large conductive area 340 of FIG. 3 and the conductive areas 440 of FIG. 4. As will be seen from the following descriptions, each conductive area 540 can be electrically connected with one or more MOSFET drains, and the power switching device drain connection area 130 of FIG. 2 can be a common drain for the many individual MOSFETs of the power switching device.

Figure 6:
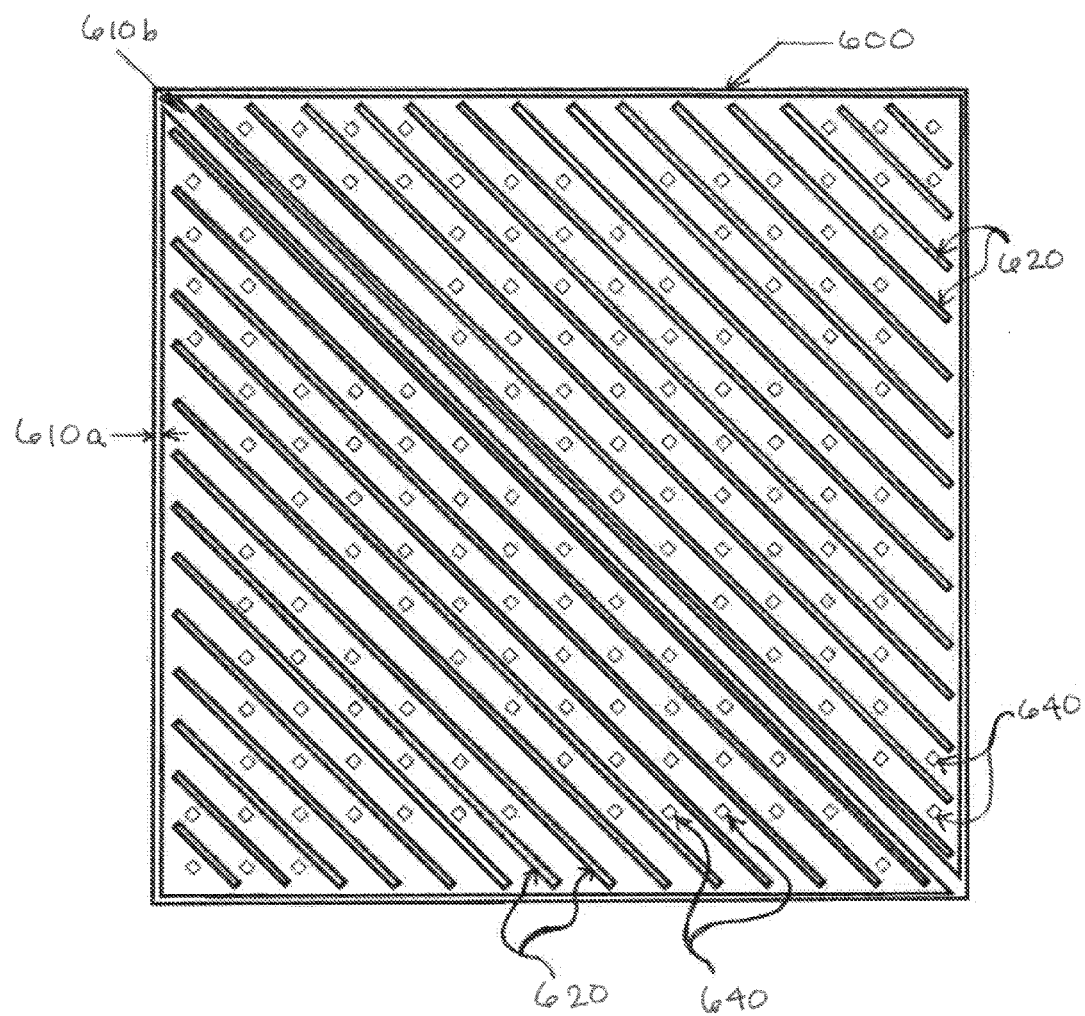
FIG. 6 conceptually illustrates another cross-section of an example power switching device.

FIG. 6 illustrates a cross-section 600 arranged below cross-section 500 of FIG. 5. Cross-section 600 includes conductive areas 610*a* and 610*b*, 620, and 640 in an otherwise non-conductive material such as a dielectric oxide.

Conductive area 610*a* is disposed around the periphery of cross-section 600, and a strip 610*b* through a diagonal of cross-section 600 such that strip 610*b* contacts area 610*a* on both ends of strip 610*b*. As can be seen from a comparison of FIGS. 5 and 6, area 610*a* and diagonal strip 610*b* overlay strip 510*a* and diagonal strip 510*b*, respectively, of cross-section 500. Conductive area 610 is in electrical contact with conductive areas 510*a* and 510*b*.

Conductive areas 620 are illustrated as strips in FIG. 6. Each conductive area 620 may alternatively be a series of conductive areas, such as multiple vias in a line. A comparison of FIGS. 5 and 6 shows that conductive areas 620 contact conductive areas 520 between insulating areas 550 surrounding vias 540. Conductive areas 620 are in electrical contact with conductive areas 520.

Conductive areas 640 are positioned between conductive areas 620. A comparison of FIGS. 5 and 6 shows that conductive areas 640 align with conductive areas (vias) 540 of cross-section 500. Conductive areas 640 are in electrical contact with corresponding conductive areas 540.

Figure 7A:
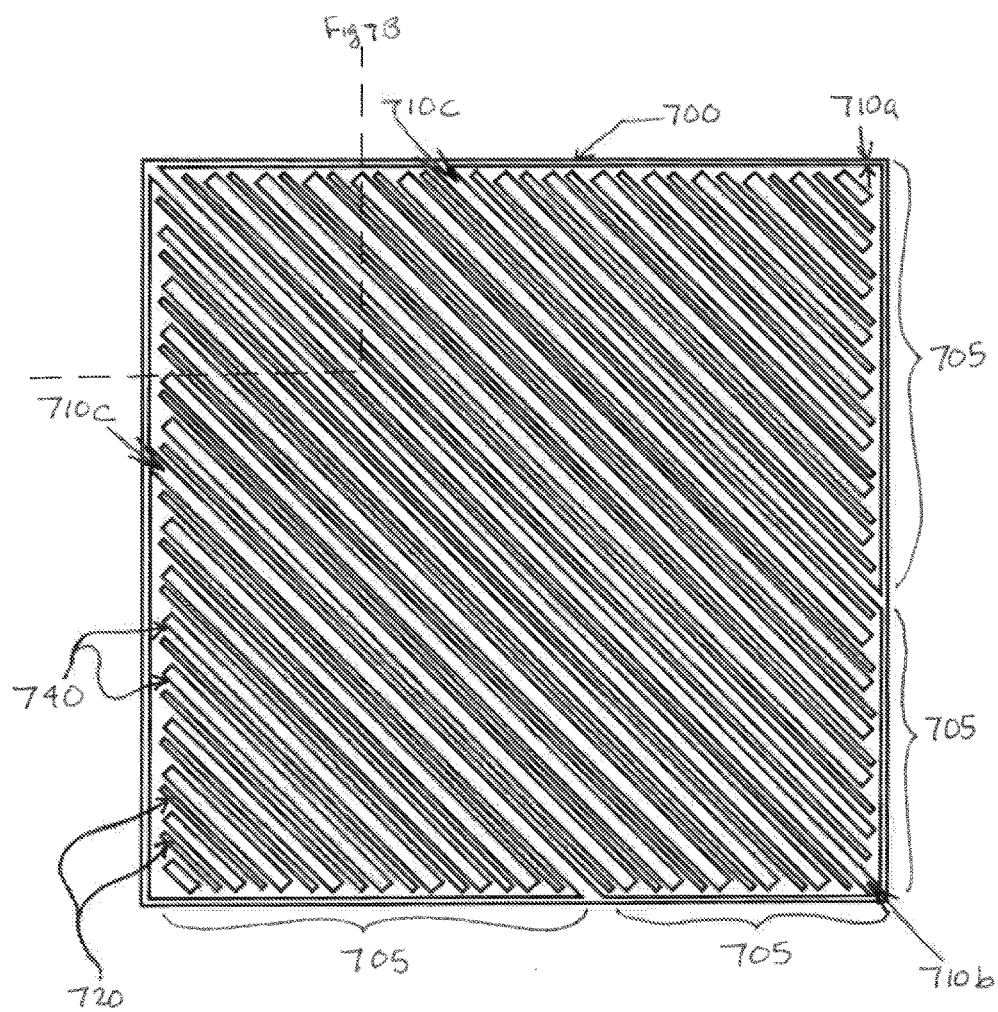
FIG. 7A conceptually illustrates another cross-section of an example power switching device.

FIG. 7A illustrates a cross-section 700 below and in electrical contact with cross-section 600 of FIG. 6. Cross-section 700 includes conductive areas 710*a*, 710*b*, 710*c*, 720, and 740 in an otherwise insulating material. Cross-section 700 may represent a cross-section through a patterned metal layer.

Conductive area 710 includes a strip 710*a* around the periphery of cross-section 700, a strip 710*b* through a diagonal of cross-section 700 such that strip 710*b* contacts area 710*a* on both ends of strip 710*b*, and strips 710*c* that are also diagonal across cross-section 700 such that strips 710*c* contact area 710*a* on the ends of strips 710*c*. As can be seen from a comparison of FIGS. 6 and 7A, area 710*a* and diagonal strip 710*b* is positioned below area 610*a* and diagonal strip 610*b*, respectively, of cross-section 600. Conductive areas 710*a*, 710*b* and 710*c* are in electrical contact with conductive areas 610*a* and 610*b*.

Conductive areas 720 are illustrated as strips in FIG. 7A. A comparison of FIGS. 6 and 7A shows that conductive areas 720 contact conductive areas 620. Conductive areas 720 are in electrical contact with conductive areas 620.

Conductive areas 740 are also illustrated as strips in FIG. 7A. Conductive areas 740 are shown as being wider than conductive areas 720. As can be seen from a comparison of FIGS. 6 and 7A, conductive areas 740 are positioned below one or more of conductive areas 640. Conductive areas 740 are in electrical contact with conductive areas (vias) 640.

Figure 7B:
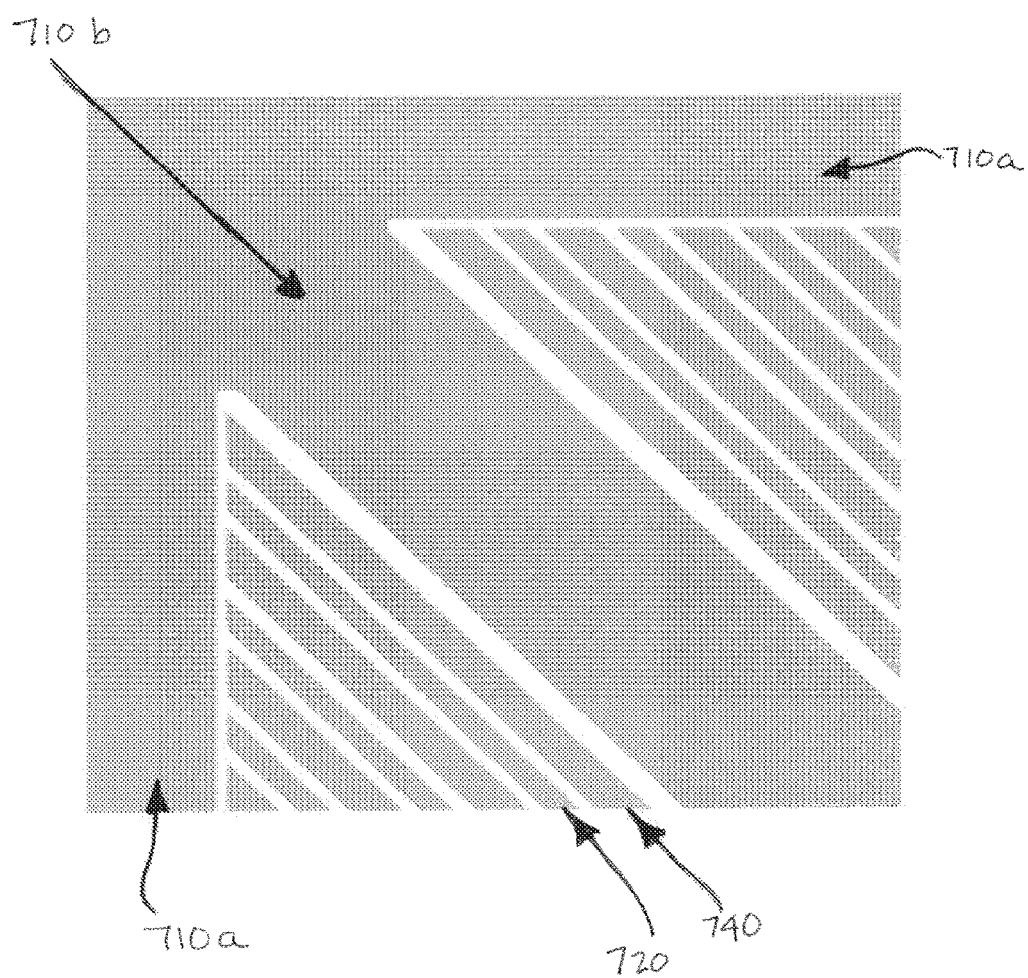
FIG. 7B conceptually illustrates an enlarged view of a portion of the power switching device of FIG. 7A.

FIG. 7B is a conceptually enlarged view of the top left corner of cross-section 700 as positioned in FIG. 7A. In FIG. 7B, the gray areas indicate conductive material, and the white areas indicate non-conductive material. Conductive area 710*a* is shown across the top and left, and strip 710*b* is shown at the diagonal. Alternating conductive areas 720 and 740 are also shown, separated from each other and from conductive areas 710*a*, 710*b* and 710*c* by insulating areas.

Figure 8:
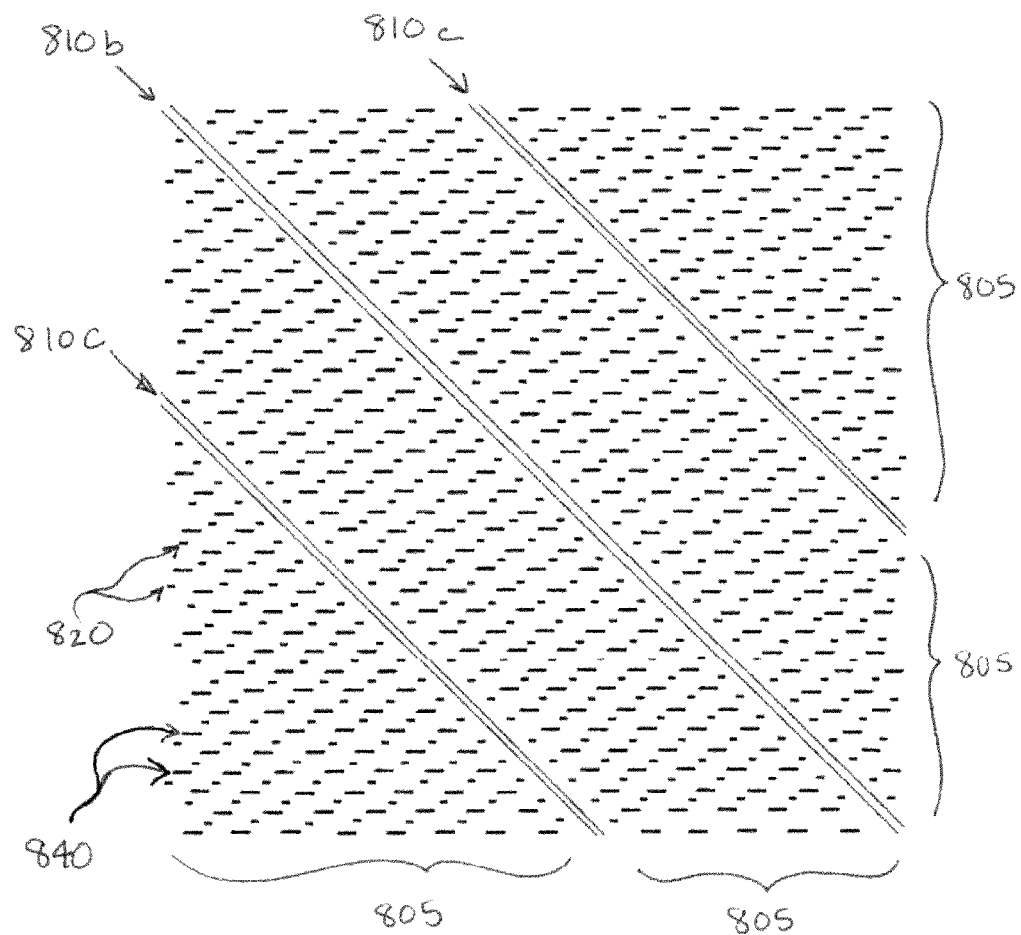
FIG. 8 conceptually illustrates another cross-section of an example power switching device.

FIG. 8 illustrates a cross-section 800 below and in electrical contact with cross-section 700 of FIG. 7A. Cross-section 800 includes conductive areas 810*a*, 810*b*, 810*c*, 820, and 840 in an otherwise non-conductive material. For example, conductive areas 810*a*, 810*b*, 810*c*, 820, and 840 may be vias through a dielectric material.

Strips 810*b* and 810*c* run diagonally across cross-section 800. Alternatively, strips 810*b* and 810*c* may each be multiple conductive areas, such as a line or lines of conductive vias, as will be discussed with respect to FIGS. 10 and 11. Cross-section 800 is divided into four sections 805. Not illustrated are optional conductive areas along the periphery of each section 805, which may be strips or sets of conductive areas such as vias and that are placed so as to make electrical contact with conductive area 710*a* of FIG. 7A. A comparison of FIGS. 7A and 8 shows that diagonal strips 810*b* and 810*c* are positioned below strips 710*b* and 710*c*, respectively, of cross-section 700. Conductive area 810 is in electrical contact with conductive area 710.

Conductive areas 820 and 840 are generally small in comparison to the conductive areas of the layers above thus far described. Conductive areas 820 and 840 are aligned in rows, and the rows are offset horizontally from each other in two directions (where "horizontal" here means in the plane of the cross section, and "vertical" means perpendicular to the plane of the cross section) such that conductive areas are also aligned in diagonals. Rows of conductive areas 820 alternate with rows of conductive areas 840, and diagonals of conductive areas 820 alternate with diagonals of conductive areas 840.

Figure 10:
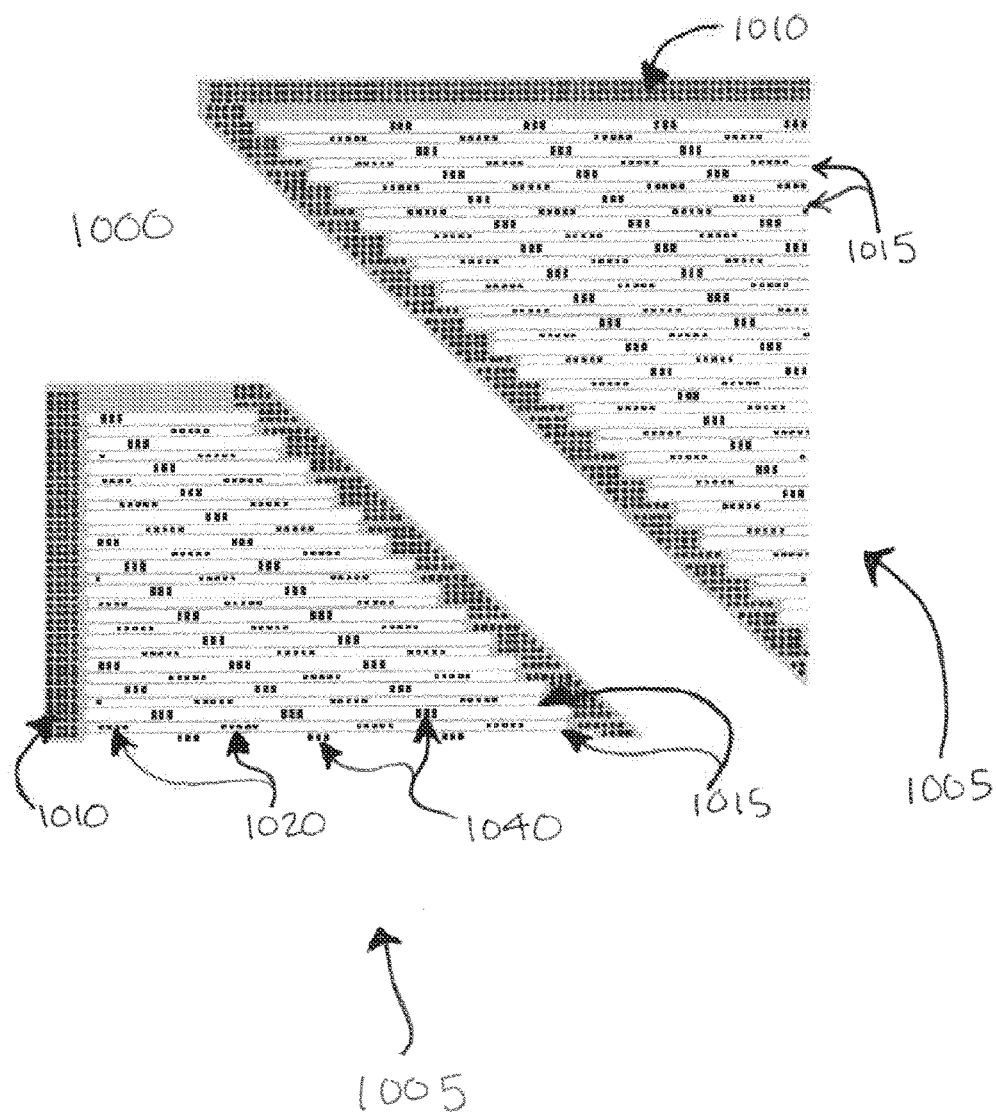
FIG. 10 conceptually illustrates an enlarged view of a portion of an example power switching device.

Each of the conductive areas 820 or 840 may be a single structure, or alternatively may be constructed as multiple structures, such as a row of multiple small vias. One example of the use of multiple vias is illustrated in FIG. 10.

A comparison of FIGS. 7A and 8 shows that diagonals of conductive areas 820 align beneath corresponding diagonals of conductive areas 720, and diagonals of conductive areas 840 align beneath corresponding diagonals of conductive areas 740. Conductive areas 820 are in electrical contact with respective conductive areas 720, and conductive areas 840 are in electrical contact with respective conductive areas 840. Thus, each of the conductive areas 820 in a diagonal is in electrical contact with all other conductive areas 820 in that diagonal through the corresponding conductive element 720, and each of the conductive areas 840 in a diagonal is in electrical contact with all other conductive areas 840 in that diagonal through the corresponding conductive area 740.

Figure 9A:
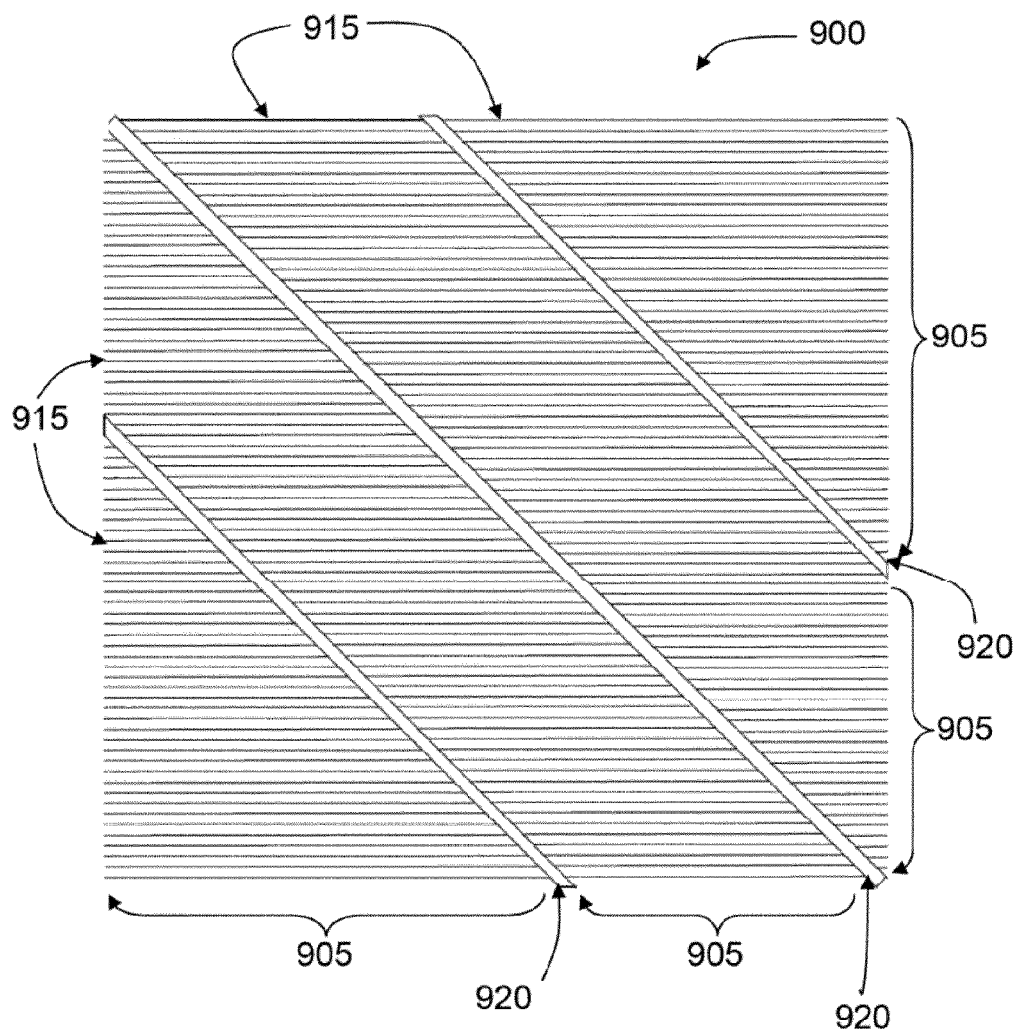
FIG. 9A conceptually illustrates another cross-section of an example power switching device.

FIG. 9A illustrates a cross-section 900 below and in electrical contact with cross-section 800. Cross-section 900 has four sections 905 each of which includes multiple parallel conductive gate run lines 915, which can be of any suitable material, including polysilicon. Each gate run 915 represents a gate conductor, which is separated by a suitable insulating material, such as a metal oxide, from the underlying semiconductor transistor channel. Thus, in FIG. 9A, channels of transistors run perpendicular to lines 915 (i.e. top to bottom). The gate runs 915 are connected in parallel by diagonal conductors 920.

Figure 9B:
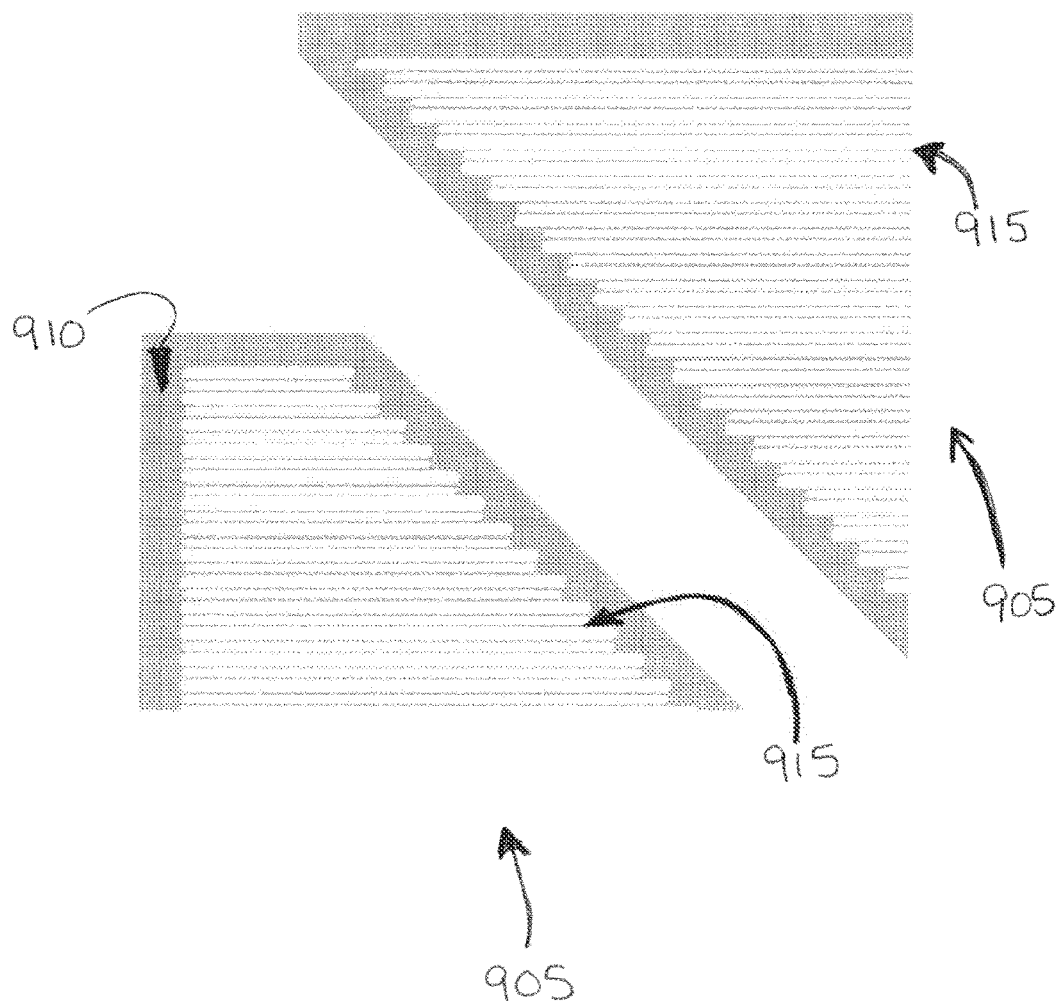
FIG. 9B conceptually illustrates an enlarged view of a portion of the power switching device of FIG. 9A.

FIG. 9B is an enlarged view of the top left corner of cross-section 900, positioned as in FIG. 9A, and illustrating portions of two of the sections 905 of FIG. 9A. At the periphery of each section 905 is a continuous conductive area 910, shown in gray. Conductive gate runs 915 are separated from each other by non-conductive areas. Each conductive gate run 915 is electrically connected at both ends to a conductive area 910 of the corresponding section 905. Thus, every conductive gate run 915 in a section 905 is electrically connected to each other through a conductive area 910.

The conductive gate runs 915 of FIGS. 9A and 9B are oriented such that gate runs 915 are aligned between the rows of conductive areas 820 and 840 of cross-section 800 in FIG. 8. Conductive gate runs 915 which are separated from the semiconductor die by an insulator form the gates of the lateral MOSFETs. Conductive areas 820 and 840 make electrical contact with semiconductor MOSFET source regions and drain regions, respectively. The gate runs 915 may be very thin vertically, in comparison to the thickness of, for example, conductive areas 520 of FIG. 5 or conductive area 340 of FIG. 3. In some implementations, conductive areas 340 or 520 may be substantially thicker, such as one or more orders of magnitude thicker, than conductive gate runs 915.

Figure 11:
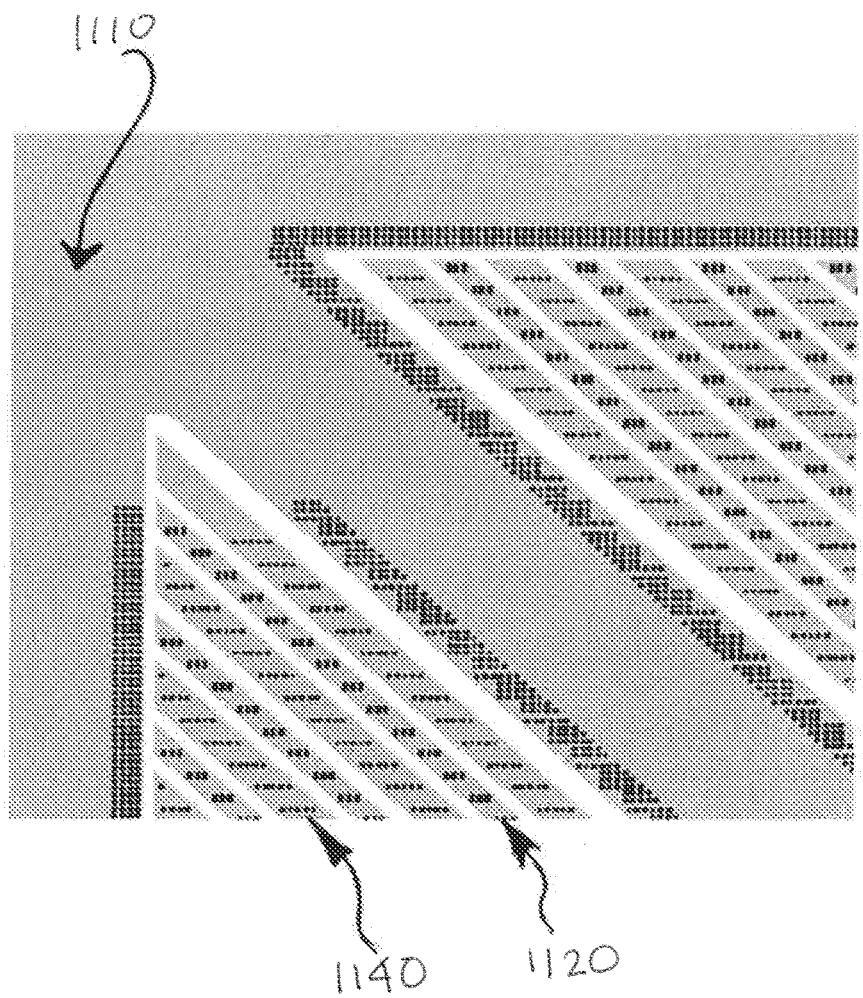
FIG. 11 conceptually illustrates an enlarged view of a portion of an example power switching device.

FIGS. 10 and 11 provide combinatorial views for a better understanding of the connections between the conductive areas of FIGS. 7A/7B and the semiconductor substrate. FIGS. 10 and 11 are described starting from the semiconductor substrate surface and moving towards the top 200 of die 100.

FIG. 10 illustrates an enlarged view of two sections 1005 of the gate runs 1015 illustrated in FIG. 9B. The gate runs 1015 are formed over and separated from the semiconductor substrate 1000 by insulation such as an oxide. The conductive areas 1010 along the periphery of each section 1005 are electrically connected to the ends of each gate run. The conductive areas 1010, which are preferably formed over inactive regions of the semiconductor substrate, provide areas in which conductive vias may be formed to connect to other metallization, e.g. as shown by the pattern of dots along runs 1010.

FIG. 10 further illustrates a pattern of conductive structures 1020, and 1040, such as was described with respect to FIG. 8, formed between respective conductive gate runs 1015 of each section 1005 which electrically connect to source and drain structures, respectively, of semiconductor substrate 1000. Conductive structures 1020 and 1040 are illustrated in FIG. 10 as being vias in sets of four and three, respectively. Alternatively, conductive areas 1020 or 1040 may be arranged in some other number of vias, including numerous vias, or in slots.

FIG. 11 illustrates an enlarged view of a conductive pattern, such as was illustrated in FIG. 7B, formed over conductive areas 1010, 1020, and 1040 of FIG. 10. Conductive area 1110 is in electrical contact with conductive areas 1010 of FIG. 10. Each conductive area 1120 is in electrical contact with a diagonal conductive area 1020 of FIG. 10, and each conductive area 1140 is in electrical contact with a diagonal conductive area 1040 of FIG. 10.

Revisiting FIGS. 2-11, it can be seen that multiple semiconductor MOSFET gates are wired together and to connection area 110, multiple semiconductor MOSFET sources are wired together and to connection area 120, and multiple semiconductor MOSFET drains are wired together and to connection area 130.

Figure 12:
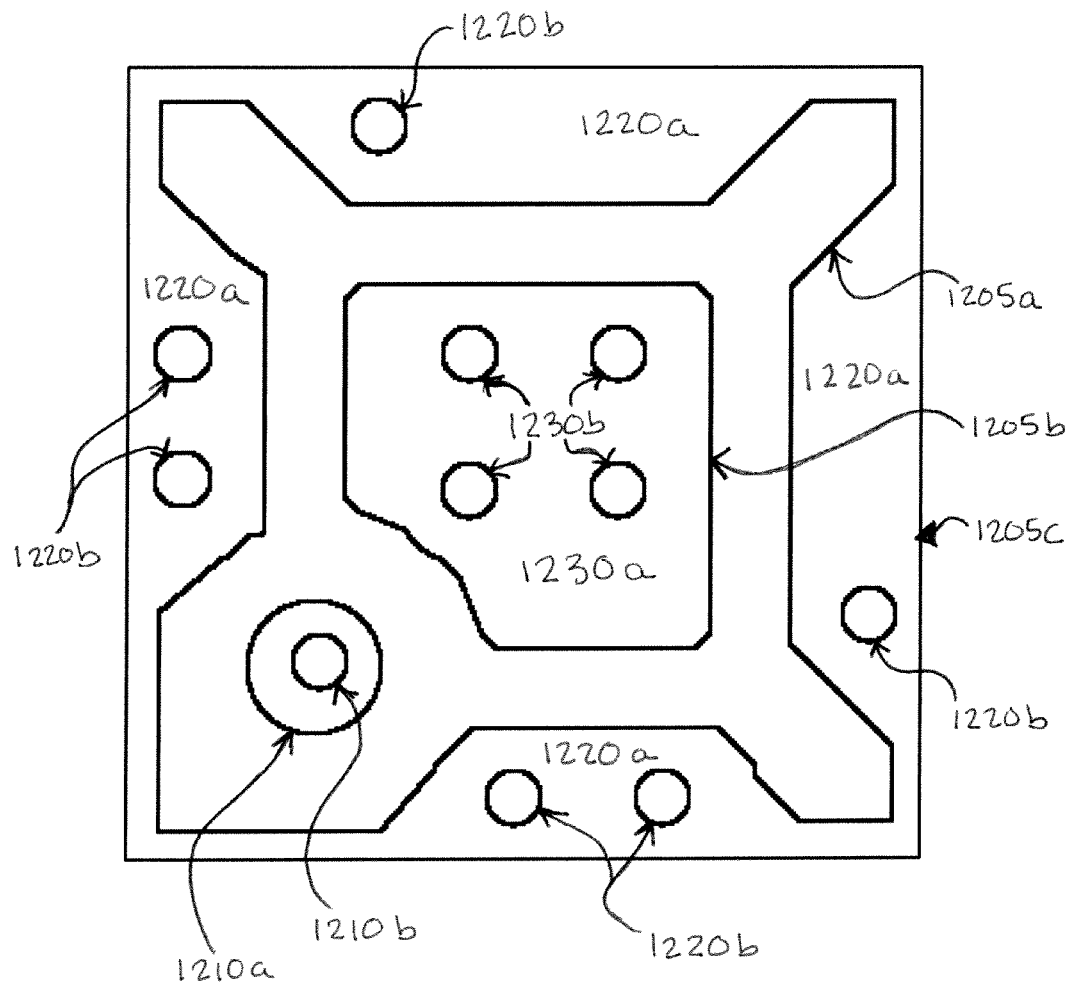
FIG. 12 conceptually illustrates an example printed circuit board trace pattern.

FIG. 12 illustrates an example of a trace pattern 1200 for a printed circuit board ("PCB") on which the MOSFET die 100 may be mounted, for example in face-down orientation as part of an LGA surface mount. The printed circuit board can be, for example, a circuit board used in a power conversion or power regulation application. The area between lines 1205a and 1205b defines a portion of the PCB without conductive traces for die 100, other than conductive trace 1210a. Trace 1210a is positioned such that it is aligned with gate connection area 110 of FIG. 1. Via 1210b is electrically connected to trace 1210a and extends from trace 1210a to a lower layer of the PCB for routing. Gate connection area 110 is soldered over trace 1210a such that connection area 110 and trace 1210a are in electrical contact.

Trace 1220a extends from line 1205a outward, for example, to line 1205c. Trace 1220a is positioned on the PCB to be aligned with and soldered to source connection areas 120 of FIG. 1 for electrical connection. Vias 1220b electrically connect with trace 1220a and extend from trace 1220a to a lower layer of the PCB for routing. Multiple solder connections may be made between connection areas 120 and trace 1220, and some connections may be for structural purposes.

Trace 1230a is within the boundaries of line 1205b. Trace 1230a is positioned on the PCB to be aligned with and soldered to drain connection area 130 of FIG. 1 for electrical connection. Vias 1230b electrically connect with trace 1230a and extend from trace 1230a to a lower layer of the PCB for routing. Multiple solder connections may be made between connection area 130 and trace 1230, and some connections may be for structural purposes.

Figure 13:
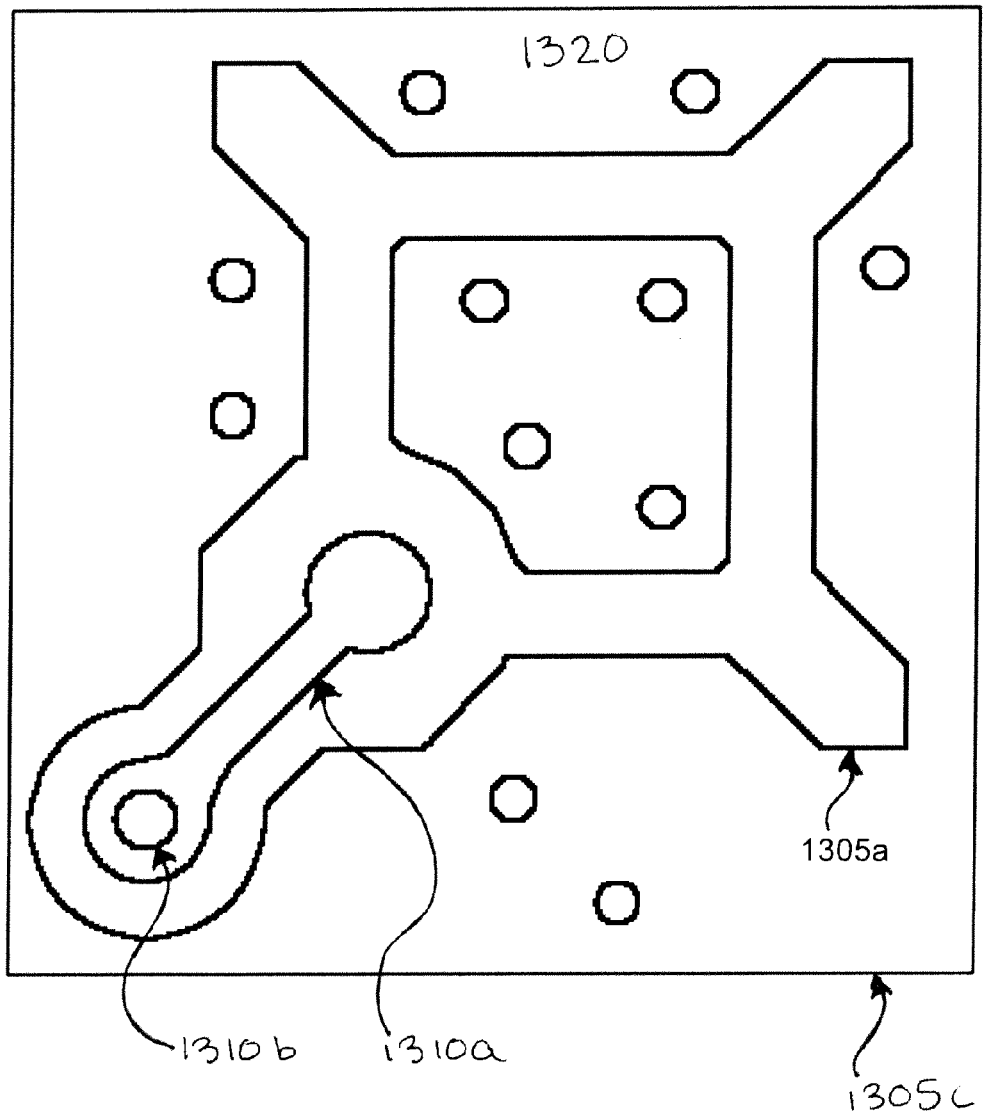
FIG. 13 conceptually illustrates another example printed circuit board trace pattern.

FIG. 13 illustrates another example of a trace pattern for a PCB on which the MOSFET die 100 may be placed. This implementation is similar to the implementation of FIG. 12, except that line 1305a is redrawn to include an extended gate trace 1310a. Gate connection area 130 of FIG. 1 is soldered to trace 1310a, which is routed on the PCB to a via 1310b. Via 1310b electrically connects with trace 1310a and extends from trace 1310a to a lower layer of the PCB for routing. Trace 1320, electrically connected to source connection area 120 of FIG. 1, extends outward from line 1305a to, for example, line 1305c.

With the described concept, multiple semiconductor MOSFET gates are electrically connected to the gate connection area 110 of die 100 through the electrical connections between lines 1015 and conductive areas 1010, and through the conductive areas 1110, 610, 510, 410, and 310. Multiple semiconductor MOSFET sources are electrically connected to the source connection area 120 of die 100 through the electrical connections between conductive areas 1020 and conductive areas 1120, and through the conductive areas 620, 520, 420, and 320. Multiple semiconductor MOSFET drains are electrically connected to the drain connection area 140 of die 100 through the electrical connections between conductive areas 1040 and conductive areas 1140, and through the conductive areas 640, 540, 440, and 340.

The low-resistance terminal paths described are accomplished through short runs of conductive material. For example, cross-sections 700 of FIG. 7A, 500 of FIG. 5, and 300 of FIG. 3 may represent just three metal layers M1, M2, and M3, respectively, separated by thin insulating layers.

The low-resistance terminal paths described are further accomplished through the use of large cross-sectional areas. For example, the source terminal includes multiple parallel vias from the semiconductor MOSFET sources extending to large areas 520 of conductive material in FIG. 5 that electrically contact large areas 420 and 320 of conductive material of FIGS. 4 and 3, respectively. Likewise, the drain terminal includes multiple parallel vias from the semiconductor MOSFET drains extending to the large area 340 of conductive material in FIG. 3.

The invention claimed is:

1. A semiconductor device comprising:
    a semiconductor substrate,
    a plurality of regions in the semiconductor substrate, the regions comprising a first type of regions and a second type of regions; and
    a plurality of conductive metallization layers disposed parallel to the semiconductor substrate, including a first metallization layer and a second metallization layer;
    wherein the first metallization layer comprises a first metal surface electrically connected to ones of the first type of regions through a first set of conductive paths, wherein the first metal surface extends horizontally such that there are enabled at least four principal axes of current flow along the first metal surface to a first connection area from a plurality of first intersection points of the first set of conductive paths and the first metal surface; and
    wherein the second metallization layer comprises a second metal surface electrically connected to ones of the second type of regions through a second set of conductive paths, wherein the second metal surface extends horizontally such that there are enabled at least four principal axes of current flow along the second metal surface to a second connection area from a plurality of second intersection points of the second set of conductive paths and the second metal surface.

2. The semiconductor device of claim 1, further comprising a first external contact area and a second external contact area, wherein the first external contact area is positioned near the center of an external surface of the semiconductor device and is electrically connected with the first metal surface at the first connection area, and wherein the second external contact area is positioned along a periphery of the external surface of the semiconductor device and is electrically connected with the second metal surface at the second connection area.

3. The semiconductor device of claim 2, wherein the second external contact area comprises multiple, separated regions concentrically arranged around the first external contact area.

4. The semiconductor device of claim 1, wherein the plurality of regions form a part of an array of field effect transistors ("FETs") that are connected to the first and second metallization layers to form a power MOSFET device.

5. The semiconductor device of claim 1, wherein the device is a power switching device for use in a power conversion or power regulation system.

6. The semiconductor device of claim 1, comprising a total device resistance when fully on having a semiconductor resistance and an interconnection resistance, wherein the interconnection resistance is less than or equal to 50% of the semiconductor resistance.

7. The semiconductor device of claim 1, wherein the plurality of conductive metallization layers includes a third metallization layer, and wherein the first and second metallization layers are each thicker than the third metallization layer.

8. A circuit board comprising the semiconductor device of claim 1, wherein the circuit board is for use in a power conversion or power regulation application.

9. A semiconductor device comprising:
    a semiconductor substrate;
    a plurality of regions in the semiconductor substrate, the regions comprising a first type of regions and a second type of regions;
    a plurality of metallization layers disposed near the substrate including a first metallization layer and a second metallization layer; and
    a plurality of conductive contact areas exposed at an exterior surface of the semiconductor device, wherein the exterior surface of the semiconductor device is configured for connection to a circuit external from the semiconductor device, the plurality of conductive contact areas including:
    one first conductive contact area, located in a central region that includes the center of the exterior surface of the semiconductor device, electrically connected to the first type of regions through the first metallization layer; and
    a plurality of second conductive contact areas located near the periphery of the exterior surface of the semiconductor device, each of the plurality of second conductive contact areas being electrically connected to ones of the second type of regions through the second metallization layer;
    wherein the plurality of second conductive contact areas are arranged concentrically around the first conductive contact area.

10. The semiconductor device of claim 9, wherein the plurality of regions form a part of an array of lateral field effect transistors ("FETs") that are connected to the first and second metallization layers to form a power MOSFET device.

11. The semiconductor device of claim 10, wherein the first type of regions are drain regions of the FETs and the second type of regions are source regions of the FETs.

12. The semiconductor device of claim 10 wherein the FET is for a power conversion or power regulation circuit.

13. The semiconductor device of claim 10,
wherein the plurality of metallization layers further includes a third metallization layer, wherein the plurality of regions further includes a third type of regions which are gate regions of the FETs, and
wherein the third metallization layer is disposed between the second metallization layer and the semiconductor substrate and is electrically connected to facilitate activation of the gate regions of the FETs.

14. The semiconductor device of claim 13 wherein the first metallization layer and the second metallization layer are thicker than the third metallization layer.

15. A power semiconductor device comprising:
an external surface configured for attachment to a circuit external to the power semiconductor device;
a first contact area exposed at the external surface of the power semiconductor device configured to carry a first current in a first direction relative to the external surface;
a plurality of second contact areas exposed at the external surface of the power semiconductor device, each second contact area configured to carry a portion of a second current in a second direction, wherein the second current is substantially equal in magnitude to the first current and has a direction relative to the external surface that is opposite to the first direction; and
wherein the second contact areas are distributed along a periphery of the external surface of the semiconductor device and substantially surround the first contact area; and
wherein there are more second contact areas carrying current in the second direction than first contact areas carrying current in the first direction.

16. The power semiconductor device of claim 15, wherein the semiconductor device is a power field effect transistor (FET), the first contact area is a drain connection, and the second contact areas are source connections.

17. The power semiconductor device of claim 15, further comprising:
a semiconductor die comprising a plurality of circuit elements formed in the semiconductor die, each circuit element comprising a first contact and a second contact; and
one or more electrical interconnections connected to carry current either between the first contact area and the first contacts of the plurality of circuit elements or between the second contact areas and the second contacts of the plurality of circuit elements.

18. The power semiconductor device of claim 15,
wherein the semiconductor device further comprises an internal electrical resistance between the first contact area and the second contact areas when the power semiconductor device is in an ON-state, the internal electrical resistance comprising a semiconductor die resistance and an interconnection resistance; and
wherein the interconnection resistance is less than half of the semiconductor die resistance.

* * * * *